(12) United States Patent
Tilke et al.

(10) Patent No.: US 11,329,126 B2
(45) Date of Patent: May 10, 2022

(54) METHOD OF MANUFACTURING A SUPERJUNCTION SEMICONDUCTOR DEVICE

(71) Applicant: Infineon Technologies Austria AG, Villach (AT)

(72) Inventors: Armin Tilke, Dresden (DE); Hans Weber, Bayerisch Gmain (DE); Christian Fachmann, Fuernitz (AT); Roman Knoefler, Langebrueck (DE); Gabor Mezoesi, Villach (AT); Manfred Pippan, Noetsch (AT); Thomas Rupp, Faak am See (AT); Michael Treu, Villach (AT); Armin Willmeroth, Friedberg (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/018,412

(22) Filed: Jun. 26, 2018

(65) Prior Publication Data

US 2018/0374919 A1    Dec. 27, 2018

(30) Foreign Application Priority Data

Jun. 27, 2017 (EP) ..................... 17178171

(51) Int. Cl.
*H01L 29/06* (2006.01)
*H01L 29/78* (2006.01)
(Continued)

(52) U.S. Cl.
CPC .... *H01L 29/0634* (2013.01); *H01L 21/31155* (2013.01); *H01L 21/76802* (2013.01);
(Continued)

(58) Field of Classification Search
CPC .................................. H01L 29/66712–66734
See application file for complete search history.

(56) References Cited

U.S. PATENT DOCUMENTS

2003/0148559 A1* 8/2003 Onishi ............. H01L 29/66712
                                                              438/138
2008/0103618 A1* 5/2008 Stirton ............. G05B 19/41875
                                                              700/108

(Continued)

FOREIGN PATENT DOCUMENTS

JP           2003258252 A        9/2003

*Primary Examiner* — Walter H Swanson
(74) *Attorney, Agent, or Firm* — Murphy, Bilak & Homiller, PLLC

(57) ABSTRACT

In an embodiment, a method of fabricating a superjunction semiconductor device includes implanting first ions into a first region of a first epitaxial layer using a first implanting apparatus and nominal implant conditions to produce a first region in the first epitaxial layer comprising the first ions and a first implant characteristic and implanting second ions into a second region of the first epitaxial layer, the second region being laterally spaced apart from the first region, using second nominal implanting conditions estimated to produce a second region in the first epitaxial layer having the second ions and a second implant characteristic that lies within an acceptable maximum difference of the first implant characteristic.

20 Claims, 22 Drawing Sheets

(51) Int. Cl.
*H01L 21/3115* (2006.01)
*H01L 21/768* (2006.01)
*H01L 29/10* (2006.01)
*H01L 29/41* (2006.01)
*H01L 29/66* (2006.01)

(52) U.S. Cl.
CPC .......... *H01L 29/1095* (2013.01); *H01L 29/41* (2013.01); *H01L 29/66712* (2013.01); *H01L 29/7802* (2013.01)

(56) References Cited

U.S. PATENT DOCUMENTS

| | | |
|---|---|---|
| 2011/0068397 A1 | 3/2011 | Disney |
| 2013/0069158 A1 | 3/2013 | Ohta et al. |
| 2014/0124851 A1 | 5/2014 | Gamerith et al. |
| 2015/0371858 A1* | 12/2015 | Laven ................ H01L 29/7802 438/530 |

* cited by examiner

METHOD OF MANUFACTURING A SUPERJUNCTION SEMICONDUCTOR DEVICE

BACKGROUND

Power semiconductor devices conduct a high load current and withstand a high blocking voltage. Superjunction devices include a superjunction structure with oppositely doped first and second regions formed in a drift zone which is electrically arranged in series with controllable MOSFET channels. Typically, the oppositely doped first and second regions each have the form of a vertical column which extends perpendicularly to the major surfaces of the device. When a blocking voltage is applied to the superjunction device, a lateral electric field rises and clears out the mobile charge carriers along the vertical pn junctions between the first and second regions. A space charge zones begins to expand perpendicularly to the direction of a load current flow in the on-state. The mobile charge carriers are completely forced out of the superjunction structure at a comparatively low blocking voltage. When the blocking voltage is further increased, the depleted superjunction structure acts as a quasi-intrinsic layer and the vertical electric field rises.

The breakdown voltage is decoupled from the dopant concentrations in the superjunction structure such that the dopant concentration in the superjunction structure can be comparatively high. Therefore, superjunction devices typically combine very low on-state resistance with high blocking capability. The efficiency of the superjunction structure in terms of blocking capability and semiconductor volume is better the better the dopant atoms in the oppositely doped regions of the superjunction structure are balanced and compensate each other.

It is desirable to improve superjunction semiconductor devices.

SUMMARY

In an embodiment, a method of fabricating a superjunction semiconductor device includes implanting first ions into a first region of a first epitaxial layer using a first implanting apparatus and nominal implant conditions to produce a first region in the first epitaxial layer comprising the first ions and a first implant characteristic and implanting second ions into a second region of the first epitaxial layer, the second region being laterally spaced apart from the first region, using second nominal implanting conditions estimated to produce a second region in the first epitaxial layer having the second ions and a second implant characteristic that lies within an acceptable maximum difference of the first implant characteristic.

In an embodiment, a method of fabricating a superjunction semiconductor device includes, for a first implanting apparatus, selecting nominal implant conditions for implanting ions into a region of an epitaxial layer of a superjunction semiconductor device such that the region has a nominal implant characteristic, wherein the first implanting apparatus comprises an intrinsic apparatus implant characteristic that is applied to the nominal implant conditions when implanting the ions using the first implanting apparatus and the nominal implant conditions to produce a region in the epitaxial layer comprising ions comprising an implant characteristic. The method further includes determining an acceptable maximum difference between a first implant characteristic of a first region comprising first ions for forming a first compensation column of a superjunction semiconductor device, the first compensation column comprising a first conductivity type, and a second implant characteristic of a second region comprising second ions for forming a second compensation column of a superjunction semiconductor device, the second compensation column comprising a second conductivity type opposing the first conductivity type, the first region and the second region being positioned in an epitaxial layer formed on a substrate. The method further includes implanting the first ions into the first region of a first epitaxial layer using the first implanting apparatus and the nominal implant conditions to produce a first region in the first epitaxial layer comprising the first ions and a first implant characteristic, and implanting the second ions into the second region of the first epitaxial layer, the second region being laterally spaced apart from the first region, using second nominal implanting conditions estimated to produce a second region in the first epitaxial layer having the second ions and a second implant characteristic that lies within the acceptable maximum difference.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the invention and are incorporated in and constitute a part of this specification. The drawings illustrate embodiments of the present invention and together with the description serve to explain principles of the invention. Other embodiments of the invention and intended advantages will be readily appreciated as they become better understood by reference to the following detailed description.

DETAILED DESCRIPTION

Figure 1A:
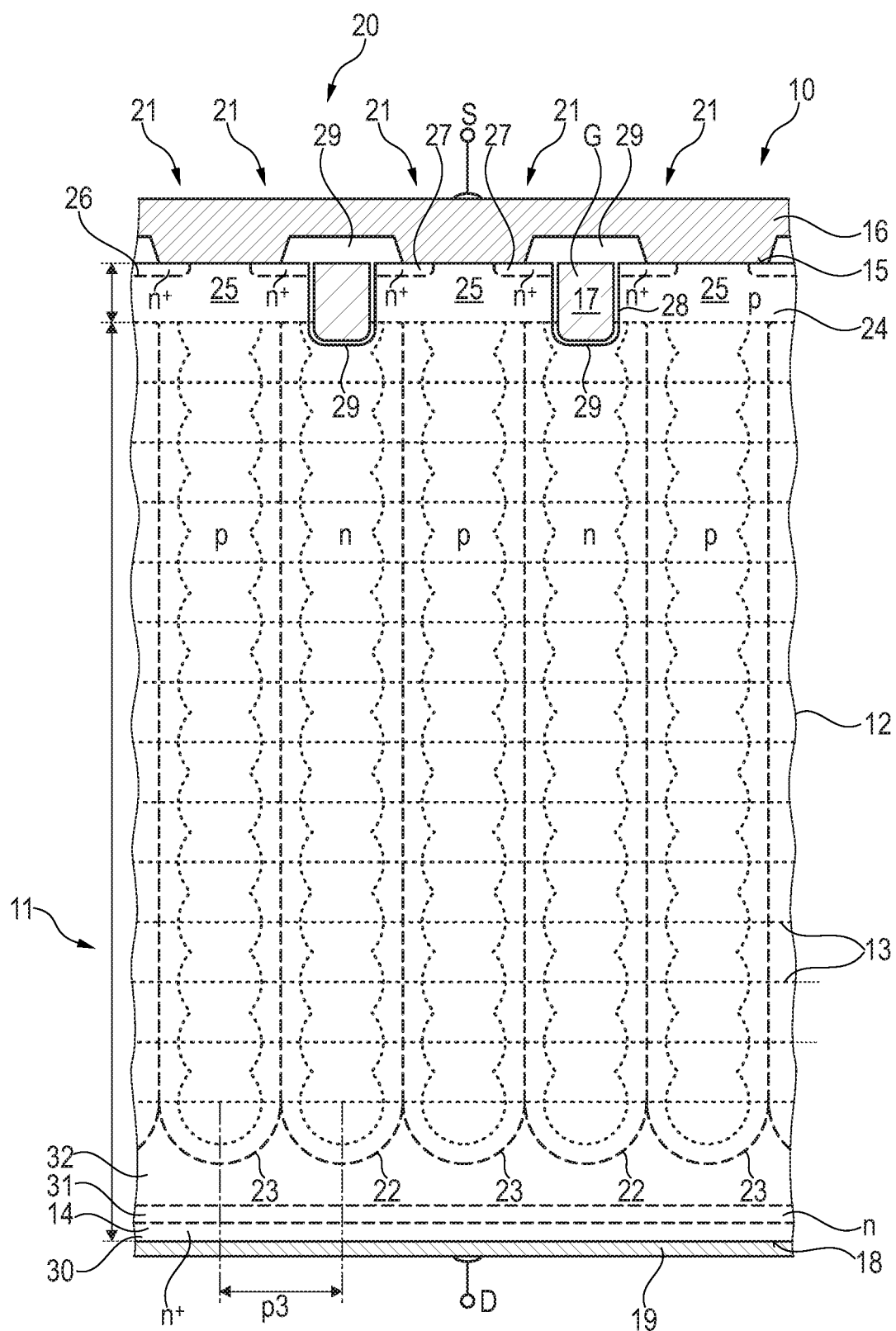
FIG. 1A illustrates a schematic cross-sectional view of a transistor device having a superjunction structure.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

The term "electrically connected" describes a permanent low-ohmic connection between electrically connected elements, for example a direct contact between the concerned elements or a low-ohmic connection through a metal and/or a heavily doped semiconductor. The term "electrically coupled" includes that one or more intervening element(s) adapted for signal transmission may be provided between the electrically coupled elements, for example, elements that are controllable to temporarily provide a low-ohmic connection in a first state and a high-ohmic electric decoupling in a second state.

As used herein, various device types and/or doped semiconductor regions may be identified as being of n type or p type, but this is merely for convenience of description and not intended to be limiting, and such identification may be replaced by the more general description of being of a "first conductivity type" or a "second, opposite conductivity type" where the first type may be either n or p type and the second type then is either p or n type.

The Figures illustrate relative doping concentrations by indicating "−" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

FIG. 1A illustrates a schematic cross-sectional view of a transistor device 10 including a superjunction structure 11.

The transistor device 10 may include an IGFET (insulated gate field effect transistor) such as a MOSFET (Metal Oxide Semiconductor Field Effect Transistor), or an IGBT (insulated gate bipolar transistor). The superjunction structure 11 may also be used in a power semiconductor diode, e.g. an MGD (MOS gated diode).

Transistor devices may be used in various applications including but not limited to use as switches in power supplies and power converters, electric cars, air-conditioners, and even stereo systems. Particularly with regard to power devices capable of switching large currents and/or operating at higher voltages, low on-state resistance $R_{on}$, high breakdown voltages $U_{bd}$, high robustness and/or good softness are often desired.

To achieve low on-state resistance $R_{on}$ and high breakdown voltages $U_{bd}$, superjunction devices may be used. Superjunction devices are also known as compensation semiconductor devices. The compensation principle is based on a mutual compensation of charges in n-doped and p-doped regions, which are often also referred to as n-doped and p-doped pillar or column regions, in the drift zone of a vertical transistor device such as a vertical MOSFET.

The transistor device 10 includes a semiconductor body 12 which is formed by depositing a plurality of semiconductor layers, indicated schematically by the dashed lines 13 in FIG. 1A, epitaxially onto a single crystal substrate 14. The semiconductor body 12 includes a first surface 15 on which a first current or load electrode 16 and a control electrode 17 are positioned and a second surface 18 opposing the first surface 15 on which a second current or load electrode 19 is positioned. The first load electrode 16 may provide a source electrode S, if the transistor device 10 is an IGFET, or an emitter electrode if the transistor device 10 is an IGBT. The second load electrode 19 may provide a drain electrode D if the transistor device 10 is an IGFET, or a collector electrode if the transistor device 10 is a IGBT. The control electrode 17 may provide a gate electrode G.

The transistor device 10 includes an active region 20 including a plurality of active or functional transistor cells 21 through which a load current directly flows in an on-state or forward mode of the transistor device 10. The active region 20 may be surrounded by an edge or termination region without active transistor cells. The edge or termination region cannot be seen in the view of FIG. 1A.

The active region 20 comprises a plurality of compensation columns 22, 23 that extend substantially parallel to one another and have a longitudinal axis that is perpendicular to the first surface 15 and second surface 18 of the semiconductor body 12. Neighbouring compensation columns have opposing conductivity types. For example, compensation columns 22 may include a first conductivity type, for example n-type, and the compensation columns 23 may include a second conductivity type opposing the first conductivity type, for example p-type. Neighbouring compensation columns 22, 23 may be spaced apart by a region of the semiconductor body 12 that is not intentionally doped. The compensation columns 22, 23 may be equidistantly spaced and have centre-to-centre pitch p3. Each of the compensation columns 22, 23 may be elongate in plan view and may have the form of a stripe that extends into the plane of the drawing.

Each compensation column 22, 23 may have an outer profile that undulates and consequently has a lateral extent that varies in the vertical direction. This form may be a consequence of the techniques used to manufacture the compensation columns 22, 23. For example, each column 22, 23 may be fabricated by implanting suitable dopants, such as ions, in a discrete zone in an epitaxially deposited layer before deposition of the next epitaxial layer on top. After the deposition of the epitaxial layers 13 is complete, a diffusion process may be performed such that the dopants diffuse outwardly from the zones vertically to such an extent that a doped column 22, 23 is formed. The dopants diffuse outwardly from the zones laterally to such an extent that the doped columns 22, 23 may meet their nearest neighbours. The thickness of the epitaxial layers 13 and spacing of the doped zones and/or the diffusion conditions may be selected such that the desired profile, height and pitch of the compensation columns 22, 23 is formed after the diffusion process.

The outermost portion of the semiconductor body 12 that forms the first surface 15 includes an epitaxial layer 24 having the second conductivity type which forms body zones 25. Wells 26 that are highly doped with the first conductivity type are arranged above the compensation columns of the first conductivity type in the epitaxial layer 24 and form source regions 27. Both the body zones 25 and the source regions 27 are electrically connected to the first load electrode 15. The control electrodes 17 are arranged above the compensation columns 22 of the first conductivity type and are electrically isolated from the compensation columns 22 and the epitaxial layer 24 by a gate oxide 28 and are electrically insulated from the first current electrode 16 by an insulating layer 29. In the embodiment illustrated in FIG. 1A, the gate electrode 17 of each transistor cell 21 is arranged in a trench 29 which extends from the first surface 15 into the upper portion of the compensation columns 22. The trench 29 is lined with the gate oxide 28. In other non-illustrated embodiments, the control electrodes 17 are planar electrodes and arranged on the first surface 15 above the compensation columns 22 and are insulated from the first surface 15 by a gate oxide layer.

In embodiments in which a planar gate is provided, i.e. the gate is arranged on the first surface 15 rather than in a trench as illustrated in FIG. 1A, the source regions 27 are arranged above the compensation columns of the second conductivity type.

A heavily doped contact layer 30 may be arranged at the second surface 18 that is electrically coupled to the second metal load electrode 19. A field stop layer 31 with a lower dopant concentration than the contact layer 30 may be arranged between the contact layer 30 and a low doped drift zone 32 into which the superjunction structure 11 extends.

The superjunction structure 11 or charge compensation structure formed by p-type and n-type compensation columns 22, 23 is arranged below the actual MOSFET-structure, with its source regions 27, body zones 26 and gates 19, and also below the associated MOS-channels in such a way that, in the off-state, the charges of the compensation columns 22, 23 can be mutually depleted and that, in the activated state or on-state, an uninterrupted, low-ohmic conduction path is formed from the first current electrode 16 near the first surface 15 to the second current electrode 19 arranged on the second surface 18.

By virtue of the compensation of the p-type and n-type dopants of the compensation columns 23, 23 of the superjunction structure 11, the doping of the current-carrying region is increased, which results in a significant reduction of the on-state resistance $R_{on}$ despite the reduction in the a current-carrying area.

As mentioned briefly, the compensation columns 22, 23 may be formed by building up the semiconductor body 12 by epitaxially depositing a plurality of layers sequentially onto a substrate, such as a silicon single crystal, and by forming discrete doped zones including donors or acceptors in each of the layers to form laterally alternate stacks of discrete zones of the same conductivity type, i.e. stacks of discrete zones comprising donors are interleaved with stacks of discrete zones comprising acceptors. A column of a particular conductivity type is formed from the stack of discrete zones by a subsequent diffusion process. In order that the compensation columns 22, 23 of opposing conductivity types are mutually depleted in the off-state, it is desirable that the doping concentration of the compensation columns 22, 23 of opposing conductivity types is similar or even as similar as possible in lateral directions.

Methods with which a difference in the dopant concentration between the compensation columns of opposing conductivity can be further reduced will now be described.

Figure 1B:
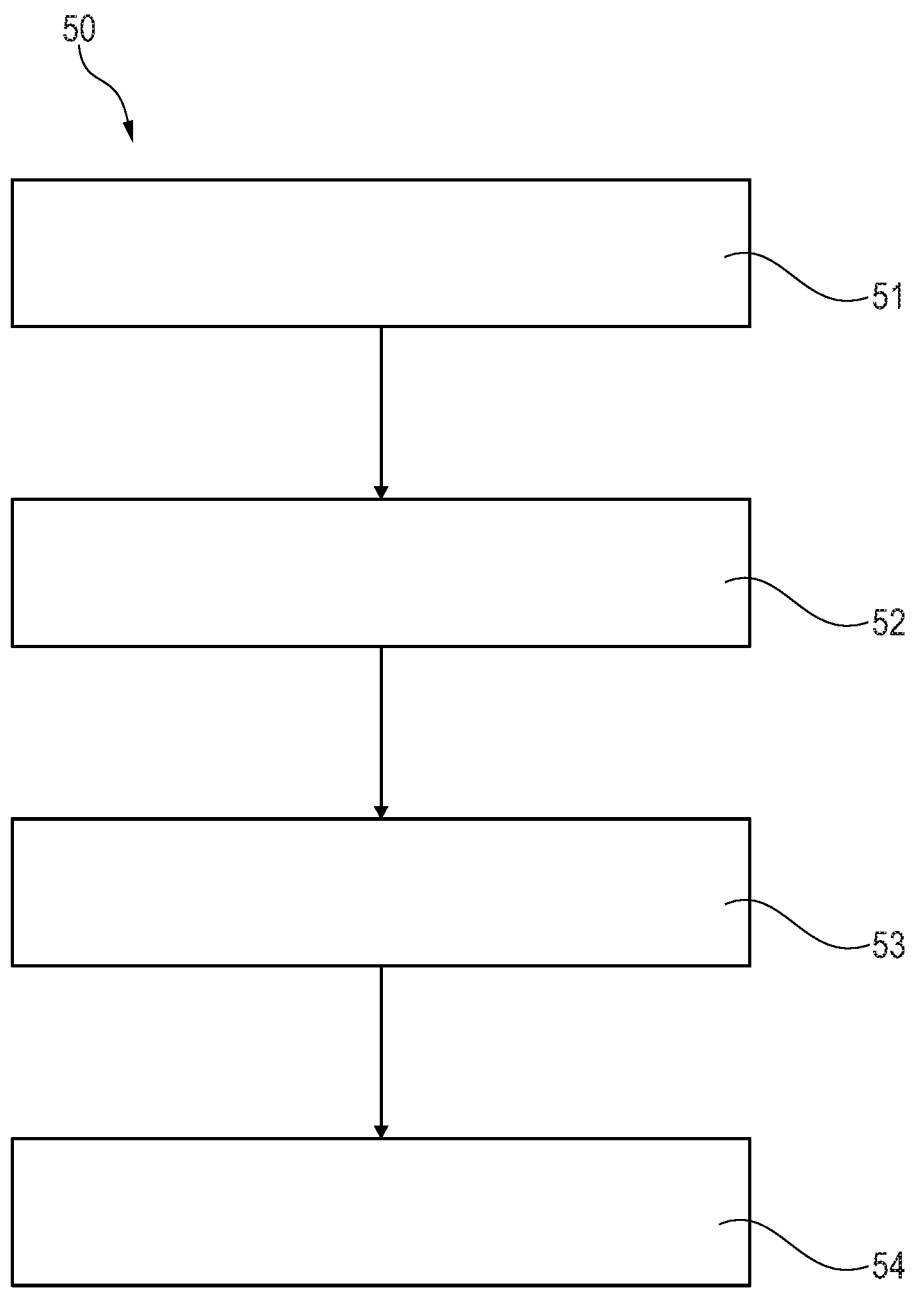
FIG. 1B illustrates a flow chart of a method of manufacturing superjunction semiconductor devices.

FIG. 1B illustrates a flow diagram 50 of a method of fabricating a superjunction semiconductor device.

In Block 51, for a first implanting apparatus, nominal implant conditions for implanting ions into a region of an epitaxial layer of a superjunction semiconductor device are selected such that the region has a nominal implant characteristic. The first implanting apparatus includes an intrinsic apparatus characteristic that is applied to the nominal implant conditions when implanting the ions using the first implanting apparatus and the nominal implant conditions to produce a region in the epitaxial layer comprising including ions having an implant characteristic. The implant characteristic of the region in the epitaxial layer may differ from the nominal implant characteristic as a result of the effect of the intrinsic apparatus characteristic on the nominal implant conditions.

In block 52, an acceptable maximum difference between a first implant characteristic of a first region including first ions for forming a first compensation column of a superjunction semiconductor device formed on the substrate and a second implant characteristic of a second region comprising second ions for forming a second compensation column of the superconductor superjunction semiconductor device formed on a substrate is determined. The first compensation column includes a first conductivity type and the second compensation column includes a second conductivity type, opposing the first conductivity type. The first region and the second region are positioned in an epitaxial layer formed on the substrate. The acceptable maximum difference in the implant characteristic is determined for a first region and a second region which are to form portions of two compensation columns of opposing conductivity type positioned within a single common epitaxial layer formed on the substrate. In some embodiments, the acceptable maximum difference is as small as possible and may even be zero In block 53, the first ions implanted into the first region of a first epitaxial layer using the first implanting apparatus and the selected nominal implant conditions to produce the first region including the first ions in the first epitaxial layer. The first region includes a first implant characteristic.

In block 54, the second ions are implanted into a second region of the first epitaxial layer. The second region is laterally spaced apart from the first region. The second ions are implanted into the second region of the first epitaxial layer using second nominal implanting conditions that are estimated to produce a second region having the second ions and a second implant characteristic that lies within the acceptable maximum difference, that is the acceptable maximum difference from the first implant characteristic of the first region. In some embodiments, the parameter of the implant characteristic that is considered is the dose of ions. Consequently, the acceptable maximum difference between the dose of first ions in the first region and the dose of second ions in the second region of the first epitaxial layer is determined. In some embodiments, more than more parameter of the implant characteristic may be considered, for example dose of ions and depth of the maximum concentration within the epitaxial layer.

The method aims to form at least one first region including first ions and at least one second region including second ions that is spaced apart from the first region in a common epitaxial layer such that the implant characteristic of the first and second regions lies within a predetermined acceptable maximum difference. For example, the implant characteristic may be the dosage and the maximum difference between the dosage in the first regions and the second regions may be determined to be ±2% or ±1% of the dosage, for example, or in embodiments in which the dosage in the first regions and the dosage in the second regions has a predetermined difference, the maximum difference between the dosage in the first regions and the second regions may be determined to be ±2% or ±1% of the predetermined difference.

The superjunction structure typically includes a plurality of compensation columns of opposing conductivity types that are arranged such that the conductivity types alternate in a lateral direction. Typically, a plurality of first regions are formed in the epitaxial layer using a single process and a plurality of second regions are formed in the epitaxial layer using a single process and the second regions are arranged laterally between and spaced apart from the first regions.

The method takes into account that the implant characteristic of the ions in the first region and in the second region is determined not only by the nominal implant conditions selected, but may also depend on an intrinsic apparatus characteristic which is intrinsic to the particular apparatus, also at a particular point in time, which is used to implant the first ions and the second ions. The intrinsic apparatus characteristic may cause a variation in the implant characteristic in the first region compared to the nominal or expected implant characteristic using the selected nominal implant conditions. In other words, the actual implant characteristic in the first region may differ from the expected nominal implant characteristic due to the influence of the intrinsic apparatus implant characteristic. Any variation may be taken into account and compensated by implanting the second ions using conditions that are expected to result in an implant characteristic that is estimated to lie within the acceptable maximum difference from the first implant characteristic or within a tolerance limit of the first implant characteristic.

The method may be used in situations in which it is undesirable or even impractical to remove the effect or effects of the intrinsic apparatus characteristic on the implant characteristic of the first ions and the first region, either entirely or to reduce the effect of the intrinsic apparatus characteristic to within the acceptable maximum difference. In some embodiments, the intrinsic apparatus characteristic causes a maximum difference in one or more parameters of the nominal implant characteristic of ±5% or ±2% or ±1%. If the intrinsic apparatus characteristic causes a maximum difference in one or more parameters of the nominal implant characteristic greater than a predetermined limit, such as ±5' of the nominal implant characteristic, the nominal implant conditions may be adjusted or the apparatus recalibrated such that the actual implant characteristic achieved lies within the pre-determined limit.

The method takes into account that the implant characteristic for compensation columns of opposing conductivity types in different epitaxial layers may differ from the desired nominal value by a greater amount than between the two regions of opposing conductivity within the same epitaxial layer without creating such a significant effect on the final properties of the superconducting superjunction device. After the first ions are implanted into the first region or regions of the first epitaxial layer, the second ions are implanted into the second region or regions of the first epitaxial layer, that is the same epitaxial layer, such that the second implant characteristic in the second region lies within an acceptable maximum difference or tolerance limit. In some embodiments, the second implant characteristic and the first implant characteristic are as similar as possible.

This reduction or even elimination of differences between the first and second implant characteristics may be achieved by taking into account that any implanting apparatus, including the first implanting apparatus used to implant the first ions into the first epitaxial layer, has an intrinsic apparatus implant characteristic and by compensating for any influence the intrinsic apparatus implant characteristic may have on the implant characteristic of the first ions in the first region when implanting the second ions into the second region, in particular in the same epitaxial layer.

In some embodiments, the second ions are implanted into the second region using the first implanting apparatus, in order to compensate for any difference between the nominal implant characteristic and the first implant characteristic in the first region such that the second region has an implant characteristic that is similar as possible to that of the actual implant characteristic of the first region or at least lies within the acceptable maximum difference, in other words, the first ions and the second ions are implanted into the first regions and second regions of a common epitaxial layer using the same implanting apparatus.

For devices using a compensation principle, opposing charges cancel each other out. Consequently, if the same difference from the nominal value, which may be thought of as an error, is applied to each of the opposing charges, the error or difference is cancelled out. By implanting the first ions into the first region and the second ions into the second region in the same epitaxial layer using the first implanting apparatus, each implanted region is subjected to the same or similar effects caused by the intrinsic apparatus characteristic of the first implanting apparatus (For example, if a particular implanting apparatus, such as the first implanting apparatus, includes an intrinsic apparatus implant characteristic which results in the actual implant characteristic in the first region having a dose which is slightly higher than the nominal dose expected using the nominal implant conditions, by using the same apparatus to implant second ions into the second region, the second region is expected to have a second implant characteristic having a dose which is slightly higher than the nominal implant characteristic as the first region and, in particular, slightly higher by the same amount from the nominal implant characteristic as the first region. Therefore, the first and second regions that include ions selected to produce opposing conductivity types in the compensation columns that are positioned within the same epitaxial layer may have a more similar and, in an ideal case, identical dose without it being necessary to determine the effects of the intrinsic apparatus implant characteristic on the actual implant characteristic achieved Additionally, the first and second region may have a more similar and, in an ideal case, identical dose without actively compensating for any difference caused by the intrinsic apparatus implant characteristic on the actual implant characteristic either when implanting the first ions into the first region or when implanting the second ions into the second region.

In order to use the same apparatus to implant the first ions into the first region and the second ions into the second region of the first epitaxial layer in a commercial setting, the usage of the production plant may be adjusted accordingly. Typically, in a commercial setting, the production plant includes a number of each of the apparatus types, for example several implanters or implanting apparatus units that are used to fabricate various types of semiconductor devices. For example, a single production plant may not be limited to producing just superjunction devices but may also be used to fabricate other types of devices. Therefore, in order to most efficiently use the production facilities such that the amount of unused equipment time is kept to a minimum and the start-to-end production period of a single device is kept low, the individual wafers are moved between the different stages of the production line and between the different apparatuses accordingly. Therefore, in order to achieve the most efficient use of the production line, the first ions and second ions are typically not implanted using the same implanting apparatus.

In order to implant the first and second ions into the first and second regions of the same epitaxial layer using the same implanting apparatus, a tracking method is required in order to note which first regions were implanted into which layer using which apparatus. Furthermore, a reorganization of the production line is necessary in order that, after the intervening processes that are carried out between the implanting of the first ions into the first regions and the implanting of the second ions into the second region, the substrate is returned to the first implanting apparatus so that the second ions can be implanted using the same implanting apparatus.

In some embodiments, two or more apparatus units may be available that have an intrinsic apparatus characteristic that is sufficiently similar that the implant characteristic produced by the two or more apparatus units lies within the acceptable maximum difference. In these embodiments, the second ions may be implanted using any one of these apparatus units and not necessarily the unit, which was used to implant the first ions.

In some embodiments, the intrinsic apparatus implant characteristic includes a time dependent component. For example, the actual dose of ions implanted using the nominal implant conditions may vary over time, for example due to ageing effects. In order to compensate for any time-dependent component, the second ions may be implanted into the second region using the first apparatus within a predetermined time period from the implanting of the first ions, in particular, within a predetermined time period measured from the finish of the process to implant the first ions.

This predetermined time period may be estimated such that a second implant characteristic is produced that lies within the acceptable maximum difference after the intrinsic apparatus implant characteristic including the time-dependent component has been applied to the nominal implant conditions. For example, if the time-dependent component of the intrinsic apparatus implant characteristic causes a drift in the actual dose implanted using the nominal input conditions which is estimated to exceed the acceptable maximum difference at a subsequent point in time, for example a period of 24 hours or 12 hours after the finishing point of implanting the first ions, the second ions may be implanted into the same epitaxial layer within this time period in order that the time-dependent component fails to result in an implant characteristic in the second region which is outside the acceptable maximum difference. Again, in these embodiments, the production line has to be controlled and adjusted accordingly such that the substrate is returned to the same implanting apparatus within the predetermined time period and the second ions are implanted into the second regions of the same epitaxial layer within the predetermined time period.

The nominal implant conditions selected for the first implanting apparatus that are used for implanting the first ions into the first region may include pressure and/or angle divergence of the beam of first ions. The maximum energy may be selected so as to implant the ions into the first region in the first epitaxial layer at a predetermined depth from the upper surface of the first epitaxial layer. The maximum energy required to implant ions at the predetermined depth may depend on the type of ion being implanted. For example, if the ions are to be implanted to a depth of 360 nm in an epitaxial silicon layer, for boron ions, a maximum energy of around 120 keV and for phosphorus ions, a maximum energy of around 285 keV may be selected. Therefore, the second nominal implant conditions used to implant the second ions into the second region may differ from the first nominal implant conditions used to implant the first ions into the first regions, also in embodiments in which the same implanting apparatus is used to implant the first ions into the first region and the second ions into the second region.

The first implant characteristic may include a dose, which may lie in the range of $1e^{12}$ cm$^{-2}$ to $1e^{14}$ cm$^{-2}$, for example around $1e^{13}$ cm$^{-2}$. In real productions scenarios, a difference in the dose between the first regions and the second regions may occur, which may be reduced to less than the acceptable maximum difference using one or more of the embodiments described herein. The acceptable maximum difference between the dose in the first regions and the second regions within a common epitaxial layer may be ±2% or ±1%

In order to implant the first ions into the first region such that the first region has a predefined position within the first epitaxial layer and is laterally limited, the first ions may be implanted using into one or more openings of a mask applied to the first epitaxial layer. Similarly, the second ions may be implanted into one or more openings of a mask applied to the first epitaxial layer, such that the second regions are laterally spaced apart from the first regions.

In some embodiments, a so-called hard mask, which may include silicon oxide for example, may be applied to first epitaxial layer. The hard mask has first openings through which the first ions may be implanted to form the first regions and second openings through which the second ions may be implanted into the second regions. In order to implant the first ions into the first regions, the openings corresponding to the second regions may be covered, for example by photoresist, and the first ions implanted through the exposed first openings into the first regions. The photoresist may be removed and a second photo resist applied which covers the first regions now including the first ions and which exposes the second openings into which the second ions may be implanted to form the second regions.

In some embodiments, two different so-called soft masks may be used for a single epitaxial layer; one for forming the first regions and one for forming the second regions, whereby the first mask is removed after implanting the first ions and the second mask is applied before implanting the second ions. A soft mask may include a photostructurable material such as a polymer, for example polyimide.

A first soft mask may be formed by applying a first photosensitive polymer layer to the first epitaxial layer, forming a first opening in the first photosensitive polymer layer such that a region of the underlying epitaxial layer is exposed within the first opening, implanting the first ions into the first opening to form the first region in the first epitaxial layer, removing the first photosensitive polymer layer, applying a second photosensitive layer to the epitaxial layer, forming a second opening in the second photosensitive polymer layer, wherein the second opening is positioned laterally adjacent and spaced apart from the first region comprising the first ions and such that the first region is covered by the second photosensitive polymer layer. The second ions are then implanted into the second opening to form the second region in the first epitaxial layer. For soft masks, photolithographic techniques may be used to form the openings in the photosensitive polymer layers and to remove the masks.

In some embodiments, the first and second photosensitive layers comprise the same material and/or have a thickness that is as similar as possible. The same process conditions may also be used to form the first and second photosensitive layers and the first and second openings in the first and second photosensitive layers, respectively. By keeping the layers and processing conditions as similar as possible, the first and second openings may be formed with less relative variation in size. This may assist in achieving a similar dose of first and second ions of opposing conductivity types, either in a single epitaxial layer or in both a single epitaxial layer and in different epitaxial layers.

In some embodiments, at least one dimension, for example a lateral dimension, such as width, of the first and second openings is as similar as possible. In some embodiments, the first opening has a nominal width $w_1$ and the second opening has a nominal width $w_2$, wherein $w_1 = w_2$.

The width of the openings used for forming the first and second regions of opposing conductivity types in a single epitaxial layer may be a similar as possible so that the nominal value of the width used to form the first openings in the first photosensitive layer and the second openings in the second photosensitive layer is the same. In some embodiments, the same nominal value of the at least one dimension, such as the width, is also used to form the openings in one ore more or all of the subsequent layers arranged on subsequently deposited epitaxial layers.

In some embodiments, the first photosensitive polymer layer comprises a first photosensitive polymer composition and the second photosensitive polymer layer comprises the first photosensitive polymer composition. In other words, the same photosensitive polymer composition is used to form both the first mask and the second mask for a common epitaxial layer. In some embodiments, the first photosensitive polymer composition is used to form the masks on two or more of the epitaxial layers.

In some embodiments, the first photosensitive polymer layer is cured using first curing conditions and the second photosensitive polymer layer is cured using the first curing conditions.

In some embodiments, the thickness of the first and second photosensitive polymer layers may be as similar as possible. In some embodiments, the first photosensitive polymer layer comprises a nominal thickness $t_1$ and the second photosensitive polymer layer comprises a nominal thickness $t_2$, wherein $t_1=t_2$.

In some embodiments, the principles described herein with reference to the implanting apparatus and in particular using the same implanting apparatus to implant the first ions and second ions into a common epitaxial layer may be applied to the lithographic apparatus used to form the first and second photosensitive polymer layers on an epitaxial layer. For example, in some embodiments, the first photosensitive polymer layer is applied to the first epitaxial layer using first lithographic apparatus and the second photosensitive polymer layer is applied to the first epitaxial layer using the first lithographic apparatus.

As discussed above, the first and second compensation columns of opposing conductivity may be built up, on a layer by layer basis, by applying a second epitaxial layer to the first epitaxial layer and implanting first ions into third regions having a third implant characteristic, the third regions beings positioned vertically above first regions and by implanting second ions into the into fourth regions, the fourth regions having a fourth implant characteristic and being positioned vertically above the second regions.

The method according to one of the embodiments described above may be used in order to implant the first ions into the third region and the second ions into the fourth region. The third implant characteristic of the first ions in the third region may differ from the first implant characteristic of the first ions in the first region by a greater amount than the difference between the first implant characteristic and the second implant characteristic within the first epitaxial layer and between the third implant characteristic and the fourth implant characteristics within the second epitaxial layer. The implant characteristics within each of the epitaxial layers may be more closely matched than the implant characteristics between different layers within the stack forming the compensation columns.

In some embodiments, the method further includes depositing a second epitaxial layer on the first epitaxial layer comprising the first region having the first ions and the second region having the second ions, implanting first ions into a third region of the second epitaxial semiconductor layer, the third region being arranged above the first region, wherein the first ions are implanted into the third region using a second implanting apparatus and third nominal implant conditions to produce a third region comprising the first ions and a third implant characteristic, wherein the second implanting apparatus comprises a second intrinsic apparatus characteristic that is applied to the third nominal implant conditions when implanting the first ions using the second implanting apparatus and the third nominal implant conditions. The method further includes implanting second ions into a fourth region of the second epitaxial layer, the fourth region being laterally spaced apart from the third region and arranged above the second region using fourth nominal implanting conditions estimated to produce a fourth region having the second ions and a fourth implant characteristic within the tolerance range.

In this method, an implanting apparatus having an intrinsic apparatus characteristic is used that may be different from the intrinsic apparatus characteristic of the first implanting apparatus, since any variation in the implant characteristic of either or both of the first ions and the second ions between epitaxial layers may be greater than any variation in the implant characteristic of the first ions and the second ions within an epitaxial layer. In some embodiments, the third nominal implant characteristic may vary from the first nominal implant characteristic.

In some embodiments, measures may be taken to avoid systematic errors, in particular systematic errors in the implant characteristic during the sequential deposition of the epitaxial layers. These systematic errors may occur, for example, if the first ions implanted into two or more of the epitaxial layers are implanted suing the same implanting apparatus and/or processed using the same lithography apparatus.

In some embodiments, a plurality of substrates are arranged in a first order in a handling device, and the method further comprises changing the order of the plurality of substrates in the handling device to produce a second order that differs from the first order before implanting first ions and second ions into a further epitaxial layer arranged on the first epitaxial layer. The substrate may be a workpiece or wafer. This method may be used to achieve layer to layer randomization in a commercial setting, for example.

Figure 1C:
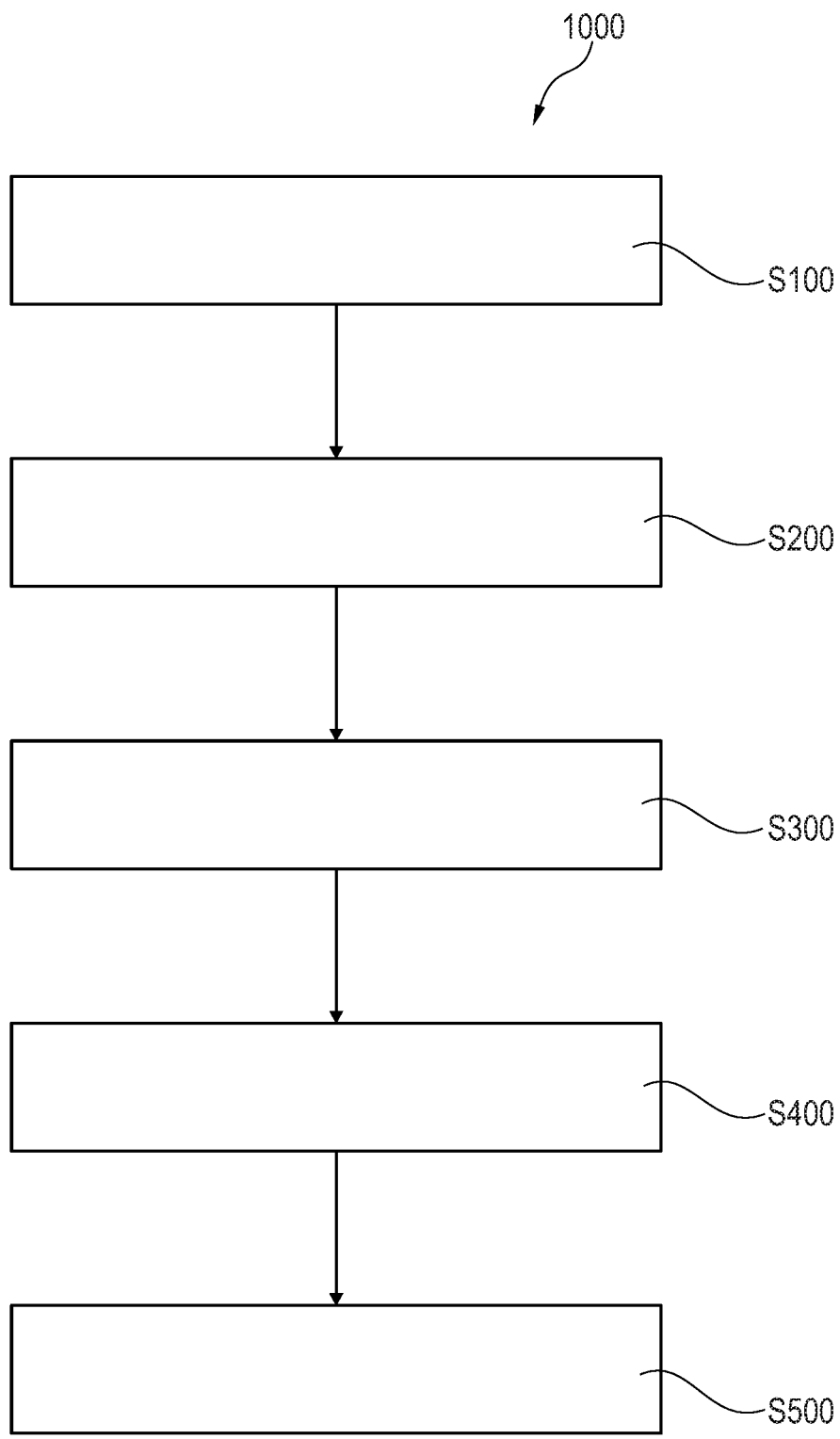
FIG. 1C illustrates a schematic flow chart of a method of manufacturing superjunction semiconductor devices using the same ion implantation apparatus for forming complementarily doped first and second regions of a superjunction structure according to an embodiment.

FIG. 1C is a schematic flow-chart for illustrating a method 1000 of manufacturing a superjunction semiconductor device according to an embodiment.

It will be appreciated that while method 1000 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted herein may be carried out in one or more separate act and/or phases.

Process feature S100 includes a step (a) for implanting ions of a first conductivity type into pre-determined first zones of a semiconductor layer epitaxially formed on a semiconductor workpiece, and process feature S200 includes a step (b) for implanting ions of a second conductivity type into pre-determined second zones of the semiconductor layer, wherein steps (a) and (b) are carried out by the same implantation apparatus.

A superjunction semiconductor device includes a superjunction structure with complementarily doped first and second regions, which completely deplete each other in a blocking state of the superjunction semiconductor device. The superjunction semiconductor device may be a power semiconductor diode, an IGFET (insulated gate field effect transistor), an IGBT (insulated gate bipolar transistor), or an MCD (MOS controlled diode), by way of example. The first conductivity type may be n-type or p-type. The second conductivity type is complementary to the first conductivity type. Ions of a n type conductivity are ions of atoms which are effective as donors. Ions of a p type conductivity are ions of atoms effective as acceptor ions in the semiconductor layer. The semiconductor workpiece may be a slice of a single-crystalline semiconductor material, e.g., a silicon wafer.

Using the same implantation apparatus for both implants in the same semiconductor layer, i.e. implanting ions of a first conductivity type of a first conductivity type into the first regions and ions of a second conductivity type of a second conductivity type opposing the first conductivity type into second regions of the epitaxially formed semiconductor layer, may assist in controlling the difference in the dopant concentrations in the first and second regions of a superjunction structure, such that the difference is reduced. This may assist in better control of the electric characteristics of superjunction devices, because any systematic process variations of the implantation on the amount of dopants in the first and second superjunction regions cancel each other out, at least to some degree.

In an embodiment, step (a) and/or step (b) may be carried out using at least two different maximum energy levels, i.e. a first maximum energy to implant the ions of a first conductivity type and a second maximum energy differing from the first maximum energy to implant the ions of a second conductivity type into the epitaxial semiconductor layer. The different maximum energies may be selected such that the implanted ions of a first conductivity type and ions of a second conductivity type come to rest at different distances in the first region and second region, respectively, with respect to a top surface of the semiconductor layer.

For example, a process feature S300 may alter the implantation energy after a first run including steps (a) and (b) at a first implantation energy and before a second run including steps (a) and (b) at a second implantation energy. For a pre-determined vertical total height of the superjunction structure and a pre-determined diffusion length for the implanted ions in a later heat treatment, implanting the ions at different energy levels allows for thicker epitaxial layer such that the total number of epitaxial layers can be reduced. The later heat treatment for forming the superjunction regions by diffusing the implanted ions may be carried out at a temperature of at least 1100° C. in $H_2/O_2$ atmosphere after the implanting steps.

The method may include a process feature S400 for forming a further epitaxial semiconductor layer, after steps (a) and (b) have been carried out. A process feature S500 may control performing at least one further run of steps (a) and (b) as steps (c) and (d) in the further epitaxial semiconductor layer. The further run includes step (c) that implants ions of the first conductivity type into predetermined first zones of the further epitaxially formed semiconductor layer, these first zone being positioned vertically above the first zone of the underlying epitaxial semiconductor layer, and further includes step (d) that implants ions of the second conductivity type into predetermined second zones of the further epitaxially formed semiconductor layer, these second zones being arranged above the second zones of the underlying epitaxial layer. Steps (c) and (d) may be carried out by the same implantation apparatus, which is different from the implantation apparatus of steps (a) and (b). Using the same implantation apparatus for the implants in the same semiconductor layer but using different implantation apparatuses for different semiconductor layers enhances process flexibility in a semiconductor manufacturing facility and may also avoid the addition of systematic errors in the stack of implanted zones of a compensation column whilst building up the stack of implanted zones.

The sequence of the first and second semiconductor layers on the workpiece defines a vertical direction of the device and the first and second pre-determined zones alternate along a lateral direction that is perpendicular to the vertical direction.

The method may include forming a first implant mask on a process surface of the semiconductor workpiece before step (a), wherein the ions of the first conductivity type are implanted through first openings of the first implant mask to form the pre-determined first zones as well as forming a second implant mask on the process surface of the semiconductor workpiece before step (b), wherein the ions of the second conductivity type are implanted through second openings of the second implant mask to form the pre-determined second zones. The first mask may be removed before the second mask is formed on the process surface.

Forming the first and second implant masks may include using a same lithography apparatus for both implants. The lithography apparatus may include several pieces of equipment, for example for applying the layer of photoresist, illuminating the layer of photoresist and developing the illuminated photo resist layer. Using the same lithography apparatus may assist in achieving finer adjustment of the dopant concentrations in the superjunction structure and a lower difference in the lateral dose in the first and second zones, because the effect of some systematic process variations of the coating, exposure and/or development process on the first and second superjunction regions may cancel each other out. For example, the lateral dimensions of the openings in the first and second masks may be more similar so that the dose of the ions of a first conductivity type and ions of a second conductivity type in the first and second zones may be more similar.

Forming the first and second implant masks may include using a same photoresist application unit for forming a photoresist layer on the exposed process surface for both implants, i.e. implanting the ions of a first conductivity type and ions of a second conductivity type into the first zone and second zones of an epitaxial semiconductor layer, and/or using a same coating, exposure and/or development unit for transferring a pattern on a reticle into a photoresist layer used for defining the first or the second implant mask and/or using a same developer unit for removing a more soluble portion of an exposed photoresist film used for defining the first or the second implant mask selectively against a less soluble portion. Use of the same units may assist in compensating for any systematic process variations of the respective process on the first and second superjunction regions.

Steps (a) and (b) may be carried out within a predetermined time period or interval, for example within 24 hours or within 12 hours such that any time-dependent error drift in the implant apparatus has a reduced impact, and systematic errors of the implantation steps (a) and (b) cancel each other out to a high degree.

A superjunction semiconductor device, in particular manufactured by using the method of any of the preceding claims includes a first semiconductor layer epitaxially formed on a semiconductor workpiece and a second semiconductor layer epitaxially formed on top of the first semiconductor layer. The sequence of the first and second semiconductor layers on the workpiece defines a vertical direction of the device. Each layer includes at least one first portion of a first conductivity type and at least one second portion of a second conductivity type.

For each layer, the second portion laterally directly adjoins the first portion in a lateral direction perpendicular to the vertical direction of the device. The second portion of the second semiconductor layer is on top of the second portion of the first semiconductor layer and the first portion of the second semiconductor layer is on top of the first portion of the first semiconductor layer to form columns comprising alternating conductivity types. A center-to-center distance in the lateral direction between the first portion and the second portion in each of the semiconductor layers may be 3.75 µm or less, or 2.7 µm or less.

The fine pitch of at most 2.7 µm allows for a dense superjunction structure with high total channel width and low device on-state or forward resistance.

Figure 1D:
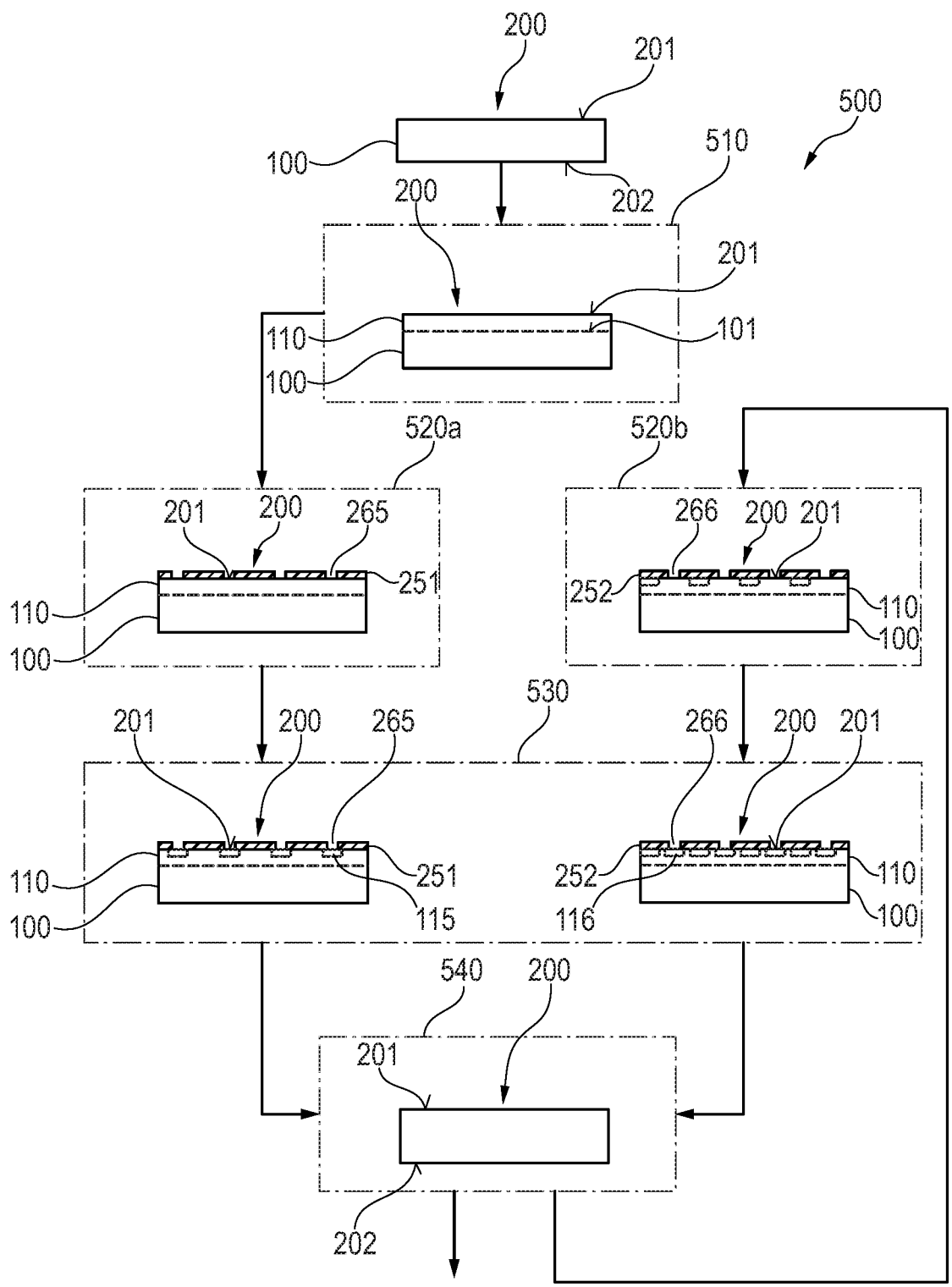
FIG. 1D illustrates a schematic block diagram illustrating a portion of a semiconductor manufacturing apparatus arrangement for manufacturing superjunction semiconductor devices using the same ion implantation apparatus for forming complementarily doped first and second regions of a superjunction structure according to an embodiment.

FIG. 1D shows a portion of a semiconductor manufacturing apparatus arrangement 500 used for forming a superjunction structure in a semiconductor workpiece 200. The semiconductor workpiece 200 includes a semiconductor base 100, which may be or may include a base substrate obtained from a semiconductor crystal, e.g., by sawing. A dopant concentration in the base substrate may be uniform. In addition to the base substrate, the semiconductor base 100 may include one or more crystalline semiconductor layers grown by epitaxy on the base substrate.

In embodiments in which the semiconductor base 100 includes more than a base substrate, the dopant concentrations and dopant types in the various layers may differ from that of the base substrate. For example, the semiconductor base 100 may include one or more intrinsic layers or layers with a background doping at a front side defined by a process surface 201 of the semiconductor workpiece 200 and a more heavily doped portion along a support surface 202 on the back, wherein the intrinsic or lightly-doped layers may include doped sub-regions. The semiconductor layer 100 may be intrinsic or only weakly doped, wherein a maximum dopant concentration is at most $1E14$ $cm^{-3}$.

The semiconductor material of the semiconductor base 100 may be silicon (Si), silicon carbide (SiC), germanium (Ge), a silicon germanium (SiGe) or an $A_{III}B_V$ semiconductor. Directions parallel to the exposed process surface 201 of the semiconductor workpiece 200 are referred to herein as horizontal or lateral directions. A direction perpendicular or normal to the process surface 201 is referred to herein as a vertical direction.

The semiconductor base 100 may be transferred into a deposition reactor 510 and a semiconductor layer 110 may be grown by epitaxy on a main surface 101 of the semiconductor base 100, wherein the main surface 101 forms the process surface 201 of the semiconductor workpiece 200 at this stage.

Epitaxy describes a process by which atoms are deposited onto the main surface, which, when arriving at the main surface 101 with sufficient energy, orient themselves to the crystal arrangement of the topmost layer in the semiconductor base 100 and form a monocrystalline semiconductor layer 110 that grows in registry with the crystallographic orientation of the topmost layer of the semiconductor base 100. After epitaxy, the exposed surface of the semiconductor layer 110 forms the new process surface 201 of the semiconductor workpiece 200.

After growing the semiconductor layer 110, the semiconductor workpiece 200 is transferred to a lithography apparatus 520a that forms a first implant mask 251 with first openings 265 on the exposed process surface 201 of the semiconductor workpiece 200. The first openings 265 are stripe-shaped with a longitudinal axis perpendicular to the cross-sectional plane of the drawing. The length of the first openings 265 along the longitudinal axis is at least ten times greater than a horizontal width of the first openings 265 parallel to the cross-sectional plane of the drawing. The first openings 265 extend parallel to each other and at least some may have equal distances between them. In some embodiments, the first openings arranged in the active region of the device are equidistant. A center-to-center distance between neighboring first openings 265 may lie in a range from 2 µm to 5.4 µm, for example, about 4.0 µm or 5.0 µm. The horizontal width of the first openings 265 may lie in a range from 0.2 µm to 2 µm, for example about 1 µm.

The semiconductor workpiece 200 including the first implant mask 251 is transferred to an ion implantation apparatus 530. The ion implantation apparatus 530 ionizes first dopants of a first conductivity type, i.e., donors or acceptors, and isolates the first dopant ions. The isolated first dopant ions are accelerated, shaped into a beam and swept across the semiconductor workpiece 200 from the front side. The first dopant ions either come to rest in the first implant mask 251 or pass through the first openings 265 and come to rest in the semiconductor layer 110. A penetration depth of the dopant ions is related to the acceleration energy effective on the dopant ions. Taking into account the limited shielding characteristics of the first implant mask 251, the acceleration energy is typically selected such that the first dopant ions passing the first openings 265 come to rest close to the process surface 201 and form shallow first implant zones 115 directly adjoining the process surface 201.

For a silicon substrate the first dopant ions may be arsenic, phosphorus or antimony ions such that the first implant zones 115 are n-type. Alternatively, the first dopant ions may be boron or aluminum ions and the first implant zones 115 are p-type.

The first implant mask 251 is removed. For example, the semiconductor workpiece 200 may be transferred to a rinsing chamber 540 that clears the process surface 201. The rinsing chamber 540 may be an isolated chamber separated from a lithography apparatus to which the semiconductor workpiece 200 is transferred in the following. The lithography apparatus 520b may be another lithography apparatus as the lithography apparatus 520a used for forming the first implant mask 251. According to an embodiment, the semiconductor workpiece 200 is transferred to the same lithography apparatus 520a that has been used for forming the first implant mask 251.

The lithography apparatus 520b forms a second implant mask 252 on the process surface 201. The second implant mask 252 includes second openings 266 centered between neighboring first implant zones 115, respectively. The second openings 266 may have the identical shape and dimensions as the first openings 265 but are shifted horizontally to the first implant zones 115 by half of the center-center distance of the first implant zones 115.

Then the semiconductor workpiece 200 is transferred to the ion implantation apparatus 530 which may have been used for implanting the first implant zones 115 in the epitaxial layer 110 of the same semiconductor workpiece 200.

Second dopant ions, that are complementary to or opposing to the first dopant ions, are implanted through the second openings 266 into the semiconductor layer 110 to form second implant zones 116 in the same plane as the first implant zones 115. The second implant zones 116 have the complementary conductivity type of the first implant zones 115. For example, in case the first implant zones 115 are n-type, the second implant zones 116 are p-type and in case the first implant zones 115 are p-type, the second implant zones 116 are n-type.

In some embodiments, in the semiconductor layer 110 both the quantity of implanted first dopant ions and the quantity of implanted second dopant ions may deviate from a target value by not more than 1% for at least 95% of the semiconductor devices obtained from a wafer lot.

Typically, an intentional detuning of the dopant doses in the second implant zones 116 with respect of the first implant zones 115 in the same horizontal plane, such as an epitaxial layer, shapes a vertical electrical field gradient in a drift zone of a semiconductor device obtained from the semiconductor workpiece. A non-uniform vertical electric field gradient may improve avalanche ruggedness, for example, but at the cost of breakdown capability for a given thickness of the semiconductor device. A high agreement of the actual dopant quantity with the target dopant quantity within a single layer and with respect to the vertical direction allows for improving the trade-off between minimum avalanche ruggedness, breakdown capability and on-state resistance.

In embodiments targeting a nearly perfect compensation in the semiconductor layer, the quantity of implanted first dopant ions deviates by less than 2% from the quantity of implanted second dopant ions.

The semiconductor workpiece 200 is transferred to a rinsing chamber 540 that removes the second implant mask 252 to clear the process surface 201.

The semiconductor workpiece 200 is transferred to the deposition reactor 510, wherein the original semiconductor base 100 and the first semiconductor layer 110 with the first and second implant zones 115, 116 formed therein form the semiconductor base 100 and the exposed surface of the first semiconductor layer 110 forms the process surface 201 for the next cycle.

The ion implantation apparatus 530 controls the applied dopant dose by counting the charges in the implant beam. Typically, a maximum error deviation from a target charge is less than 2%. The error deviation of the counted charges from the actual number of charges contains a systematic or correlated error portion and a random or noise error portion. The systematic portion contains a significant common-mode portion that does not depend on the conductivity-type but applies to both dopant atoms in the same way. Since the degree of charge compensation between the superjunction regions depends on the deviation of the number of charges in the complementarily doped superjunction regions relative to each other, the effects of the common-mode portion of the systematical error for both implants cancel each other out, if the same ion implantation apparatus 530 is used for both implants. As a result, a higher degree of charge compensation can be achieved as it is the case when two different ion implantation apparatus implant the first and second implant zones 115, 116 in the same semiconductor layer.

According to an embodiment both implantations in the same semiconductor layer 110 are performed within a predetermined time period to avoid the effects of any time-dependent variation or drift. For example, the time period may be 24 hours, e.g., within 12 hours such that only a comparatively low number of other semiconductor workpieces 100, e.g., less than 100 wafer lots, e.g., less than 100 semiconductor workpieces are processed at the same implantation apparatus between the implants into the same semiconductor layer 100 of the same semiconductor workpiece 100.

The method of FIG. 1B may assist in reducing the deviation of the number of dopants from a target quantity in the first and second superjunction regions to below ±2% in a layer or between layers. According to an embodiment targeting at a nearly perfect compensation in at least one of the semiconductor layers 110, the quantity of implanted first dopant ions deviates by less than 2% from the quantity of implanted second dopant ions in at least 50% of the semiconductor layers 110 or even in all the semiconductor layers 110.

Assuming a given tolerance for tools that define the number of dopants in the first and second regions, the relative deviation between the quantity of dopants in the first and in the second regions increases with shrinking horizontal dimensions.

Using the same implantation and/or lithography apparatus for the definition of both the first and the second dopant regions in the same plane reduces the relative deviation and therefore allows for further shrinking the center-to-center distance between the superjunction regions without that the charge balance gets stronger detuned.

Shrinking the horizontal dimensions of the superjunction regions allows for further increasing the dopant concentration in the semiconductor regions such that the on-state resistance can be further reduced.

FIGS. 2A to 2J illustrate details of a semiconductor workpiece 200 in the course of processing.

Figure 2A:
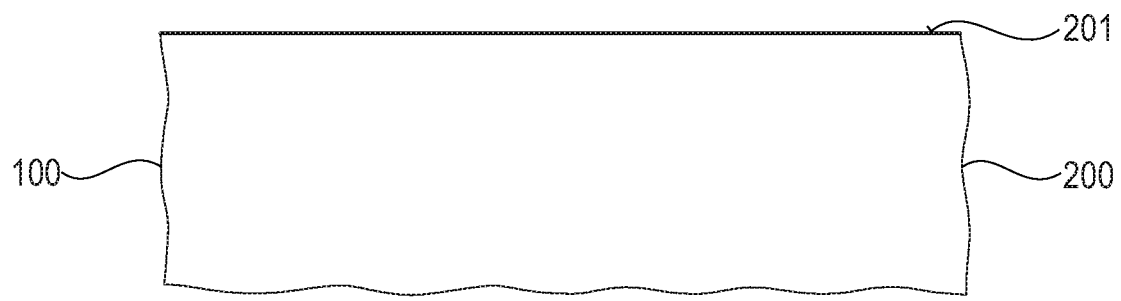
FIG. 2A illustrates a schematic vertical cross-sectional view of a portion of a semiconductor workpiece for illustrating a method of manufacturing a superjunction semiconductor device according to an embodiment.

FIG. 2A shows a semiconductor workpiece 200 with a semiconductor base 100 that includes a base substrate and that may include one or more semiconductor layers sequentially grown by epitaxy on the base substrate. The semiconductor workpiece 200 may be a semiconductor wafer with a diameter of 300 mm. A lithography apparatus may be used to deposit and pattern a mask layer on the process surface 201 of the semiconductor workpiece 200 by photolithography.

Figure 2B:
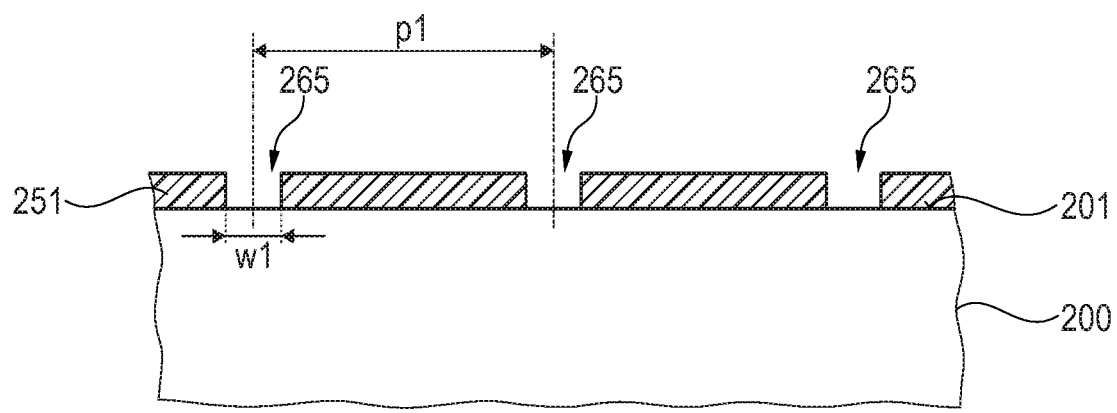
FIG. 2B illustrates a schematic vertical cross-sectional view of the semiconductor workpiece portion of FIG. 2A, after forming a first implant mask with first openings on a process surface.

FIG. 2B shows a first implant mask 251 obtained by patterning the mask layer. The first implant mask 251 includes first openings 265, wherein a center-to-center distance p1 of neighboring first openings 265 is in a range from 2 μm to 5.4 μm, for example, about 4.0 μm or 4.5 μm. A horizontal width w1 of the first openings 265 is in a range from 0.2 μm to 2 μm, for example, about 1 μm. The first openings 265 are parallel stripes with a longitudinal axis perpendicular to the cross-sectional plane of the drawing. The first implant mask 251 may be an exposed and developed photoresist film or soft mask.

In some embodiments, a hard mask from, e.g., silicon oxide or silicon nitride, may be used in place of the two soft masks. The hard mask includes openings corresponding to the first and second zones and, therefore, to the first and second openings of the two soft masks. When implanting ions into the first zones, the openings above the second zones are covered and when implanting ions into the second zones, the openings above the first zones are covered. The hard mask may be patterned, i.e. the openings covered, by using a photoresist film.

Figure 2C:
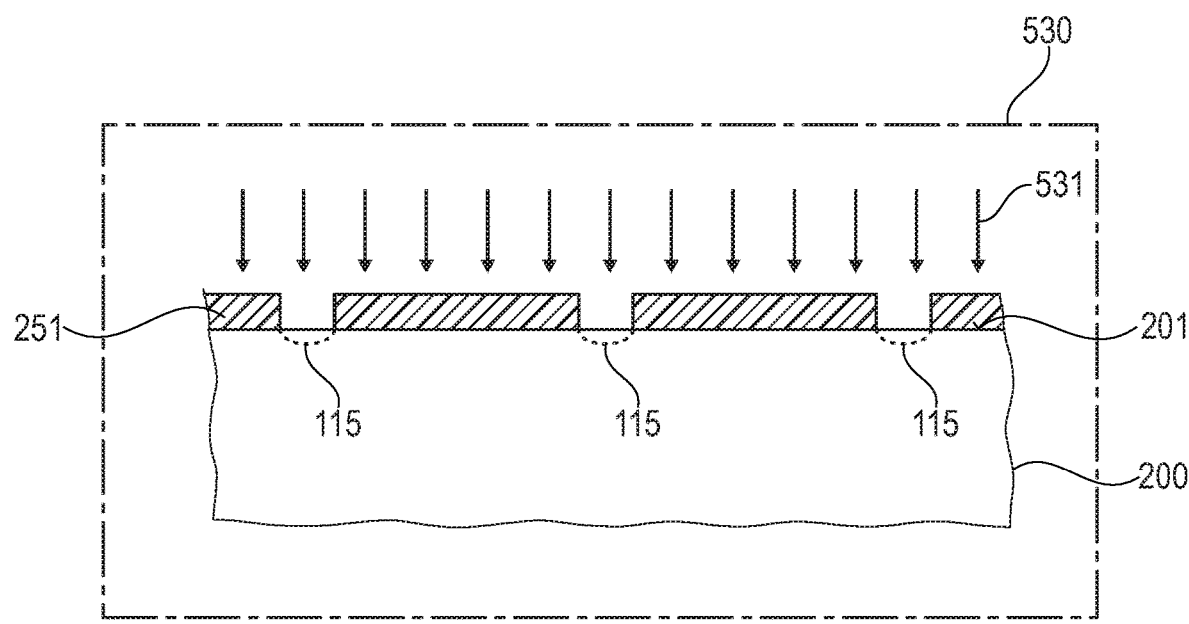
FIG. 2C illustrates a schematic vertical cross-sectional view of the semiconductor workpiece portion of FIG. 2B, during implantation of first dopants through the first openings.

As illustrated in FIG. 2C, an ion implantation apparatus 530 generates and shapes an ion beam 531 with a defined flow of first dopant ions. The ion beam 531 is swept across the process surface 201. The first implant mask 251 shields portions of the semiconductor workpiece 200 against the first dopant ions.

First dopant ions penetrating through the first openings 265 form first implant zones 115 in the semiconductor workpiece 200 close to the process surface 201 with the lateral extent controlled by the lateral size of the first openings 265. The first implant mask 251 is removed, e.g., rinsed away in case the first implant mask 251 is a developed photoresist film.

Figure 2D:
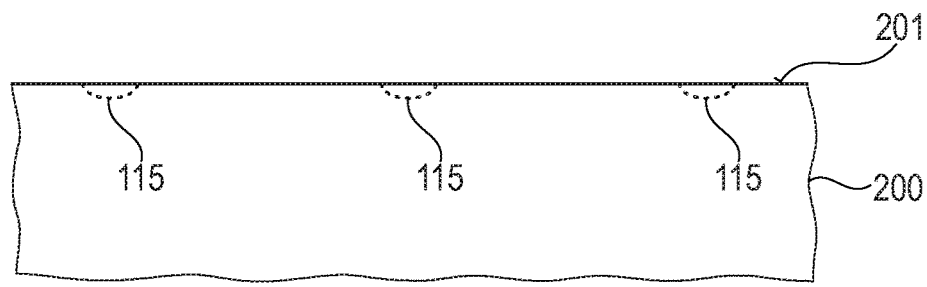
FIG. 2D illustrates a schematic vertical cross-sectional view of the semiconductor workpiece portion of FIG. 2C, after clearing the process surface.

FIG. 2D shows the semiconductor workpiece 200 with the cleared process surface 201 and the first implant zones 115 directly adjoining the process surface 201. A second implant mask 252 is formed on the cleared process surface 201. at least some of the subunits of the lithography apparatus used for forming the first implant mask 251 of FIG. 2B may be used.

Figure 2E:
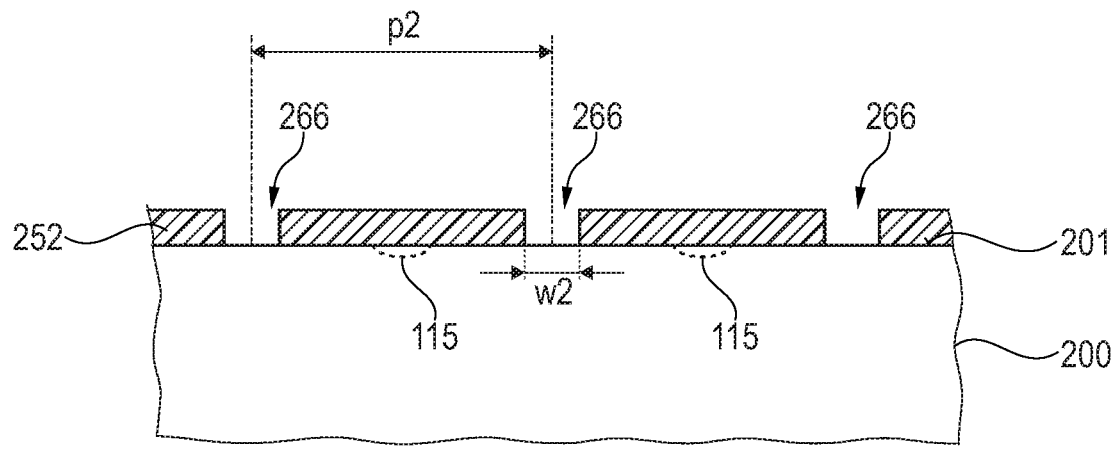
FIG. 2E illustrates a schematic vertical cross-sectional view of the semiconductor workpiece portion of FIG. 2D, after forming a second implant mask with second openings on a process surface.

FIG. 2E shows the second implant mask 252 with the second openings 266. The second openings 266 are arranged between and may be equidistantly spaced from neighboring first implant zones 115. In some embodiments, a second width w2 of the second openings 266 deviates by not more than 0.2 μm from the first width w1 of FIG. 2B. According to an embodiment the nominal second width w2 is equal to the nominal first width w1 of FIG. 2B. A second pitch p2 of the second openings 266 may be equal to the first pitch p1 of the first openings 265 as illustrated in FIG. 2B.

The same ion implantation apparatus 530 that has formed the first implant zones 115 of FIG. 2C forms second implant zones 116 in the same plane as the first implant zones 115.

Figure 2F:
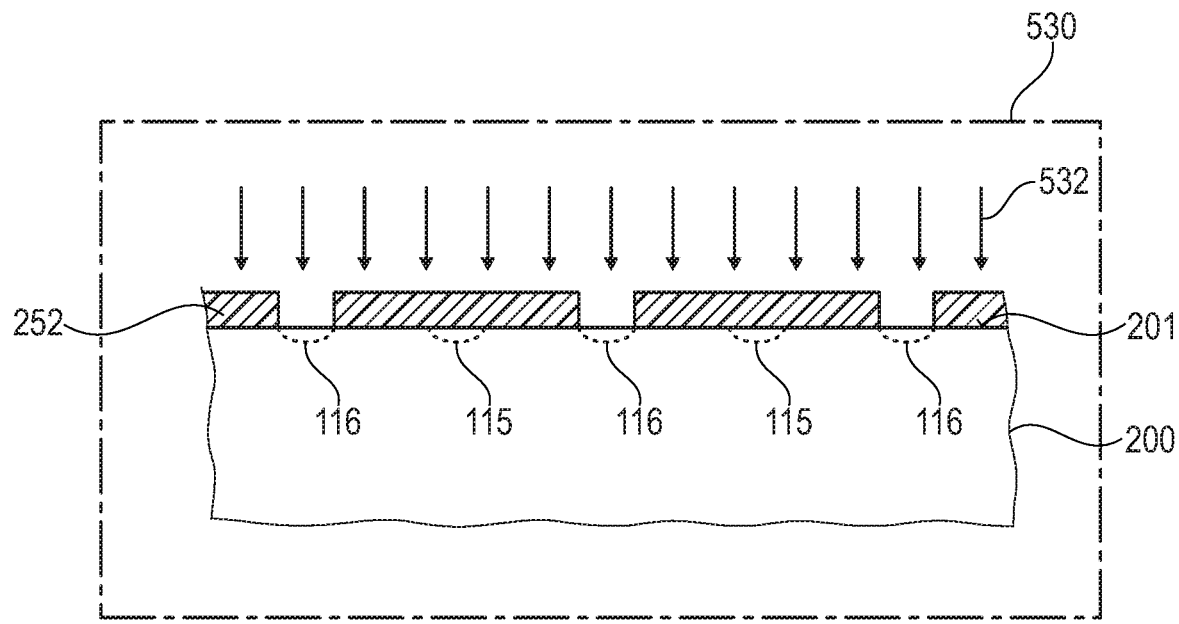
FIG. 2F illustrates a schematic vertical cross-sectional view of the semiconductor workpiece portion of FIG. 2E, during implantation of second dopants through the second openings.

According to FIG. 2F the second implant zones 116 are formed in the semiconductor workpiece 200 in the process surface 201 in the second openings 266.

Figure 2G:
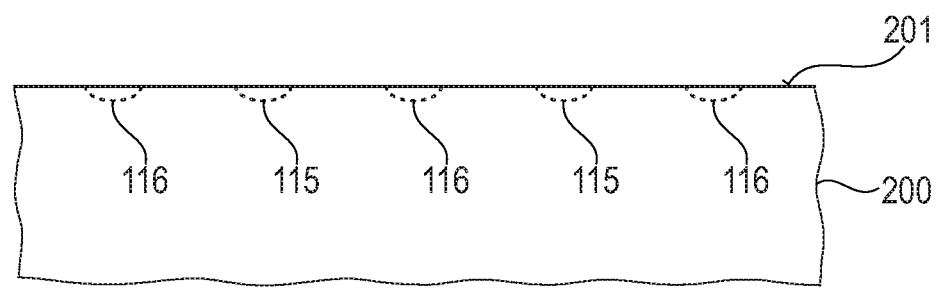
FIG. 2G illustrates a schematic vertical cross-sectional view of the semiconductor workpiece portion of FIG. 2F, after clearing the process surface.

FIG. 2G shows the semiconductor workpiece 200 after removing the second implant mask 252. The uppermost surface includes alternating regions or zones comprising ions of a first conductivity type and ions of a second conductivity type. The regions are spaced apart from the immediate neighbours by a portion of the semiconductor layer 110 which has a dopant concentration that is less than the regions or zones. The uppermost surface provides the new process surface 201 on which the next layer of the superjunction structure is formed.

A further semiconductor layer 110 is grown by epitaxy on the process surface 201 of the semiconductor workpiece 200 of FIG. 2G.

Figure 2H:
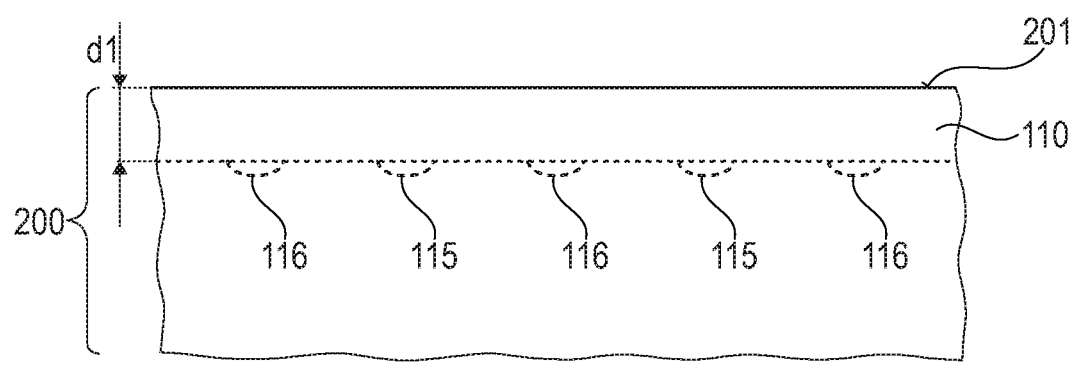
FIG. 2H illustrates a schematic vertical cross-sectional view of the semiconductor workpiece portion of FIG. 2G, after forming a semiconductor layer on the cleared process surface.

FIG. 2H shows the semiconductor workpiece 200 with the exposed surface of the grown epitaxial semiconductor layer 110 forming the process surface 201. A layer thickness dl of the semiconductor layer 110 is at most 3.0 μm. The comparatively thin semiconductor layer 110 can be grown by epitaxy at comparatively low epitaxy temperatures of at most 1170° C. At temperatures below 1170° C., the epitaxial crystal grows at high quality and at a low density of lattice defects such as crystal sliding planes. The cycle of forming the first and second implant zones 115, 116 and epitaxial growth to form a further epitaxial layer on the underlying epitaxial layer includes first and second implant zones may be repeated to form a multi-layer structure include stacks of first implant zones and stack of second implant zones which may be spaced apart from the neighbours in the stack by portions of the epitaxial layer. The number of times these processes are repeated may depend on the desired blocking voltage of the finished device, e.g. for 600V, at least twelve times.

Figure 2I:
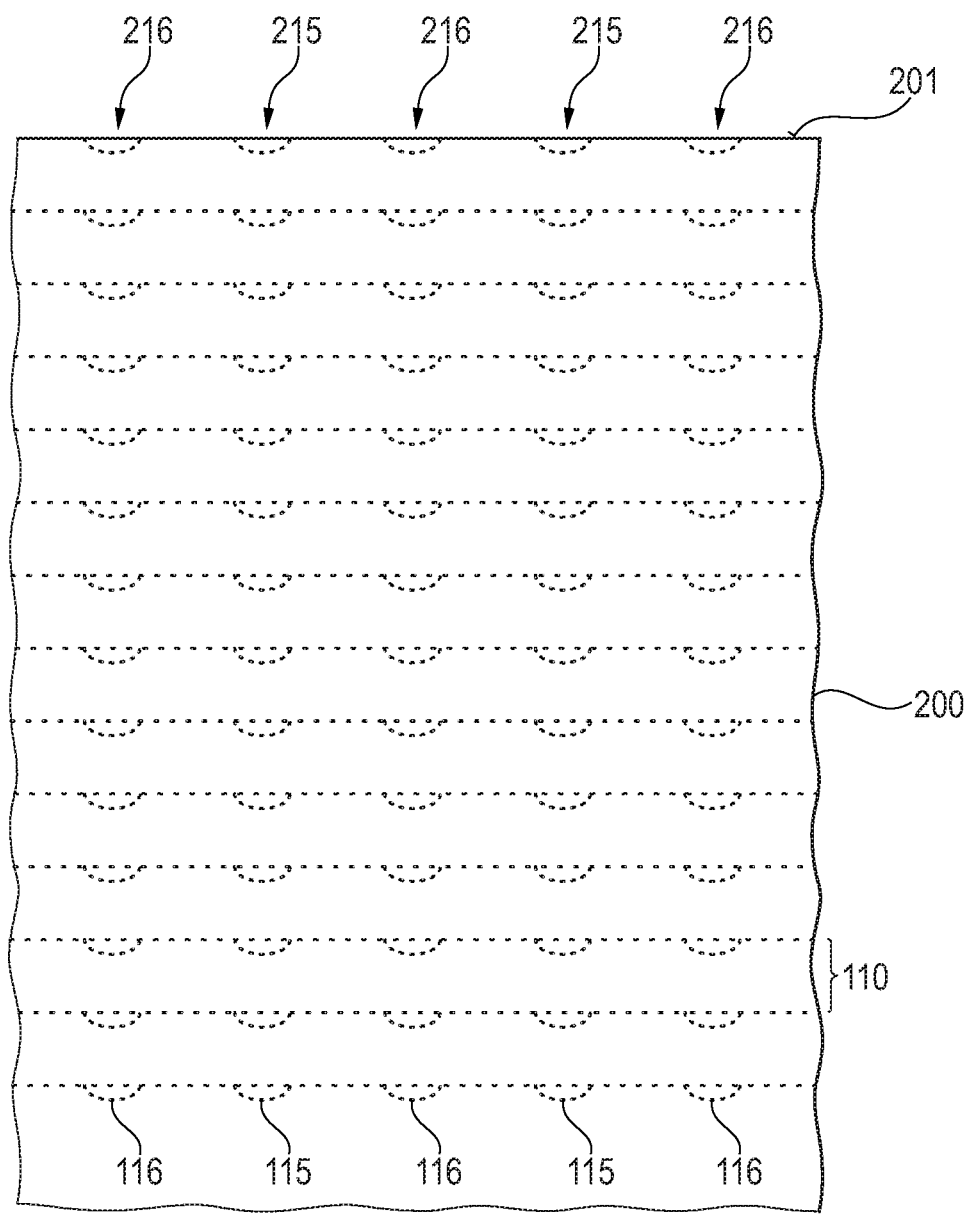
FIG. 2I illustrates a schematic vertical cross-sectional view of the semiconductor workpiece portion of FIG. 2G, after repeating thirteen times the steps of FIGS. 2B to 2H and a further implant of first and second zones.

FIG. 2I shows the semiconductor workpiece 200 after 13.5 cycles including fourteen paired implants through two different implant masks for a single epitaxial layer and thirteen intermediate epitaxial growth steps. The first and second implant zones 115, 116 form first and second vertical columns 215, 216. During each epitaxy, the first and second implant zones 115, 116 previously formed are subjected to a heating which may diffuse the implanted dopants to a certain, comparatively low extent vertically and horizontally (not shown).

After the formation of the stacks of first and second zones, a heat treatment may be performed at temperatures in a range from 1000° C. to 1200° C. for 30 min to 300 min, for example, in an oxidizing atmosphere, e.g., at 1100° C. for 100 min in a $H_2/O_2$ atmosphere.

During the heat treatment the dopant ions in the first and second implant zones 115, 116 diffuse vertically and horizontally to an extent, that the vertically spaced first implant zones 115 of FIG. 2I form doped first portions merge to form first columns comprising a first conductivity type and the vertically spaced second implant zones 116 of FIG. 2I form second portions merge to form second columns comprising a second conductivity type opposing the first conductivity type. From the first vertical columns 215 of first implant zones 115 the heat treatment forms first regions 181 and from the second vertical columns 216 of second implant zones 116 the heat treatment forms second regions 182 of a superjunction structure 180. The dopant ions in the first and second implant zones 115, 116 also diffuse laterally such that in each semiconductor layer 110 first portions of the first regions 181 formed from the first implant zones 115 of FIG. 2I and second portions of the second regions 182 formed from the second implant zones 116 of FIG. 2I form pn junctions. According to an embodiment a mean diffusion length of the n-type dopants is about 1.3 μm.

Figure 2J:
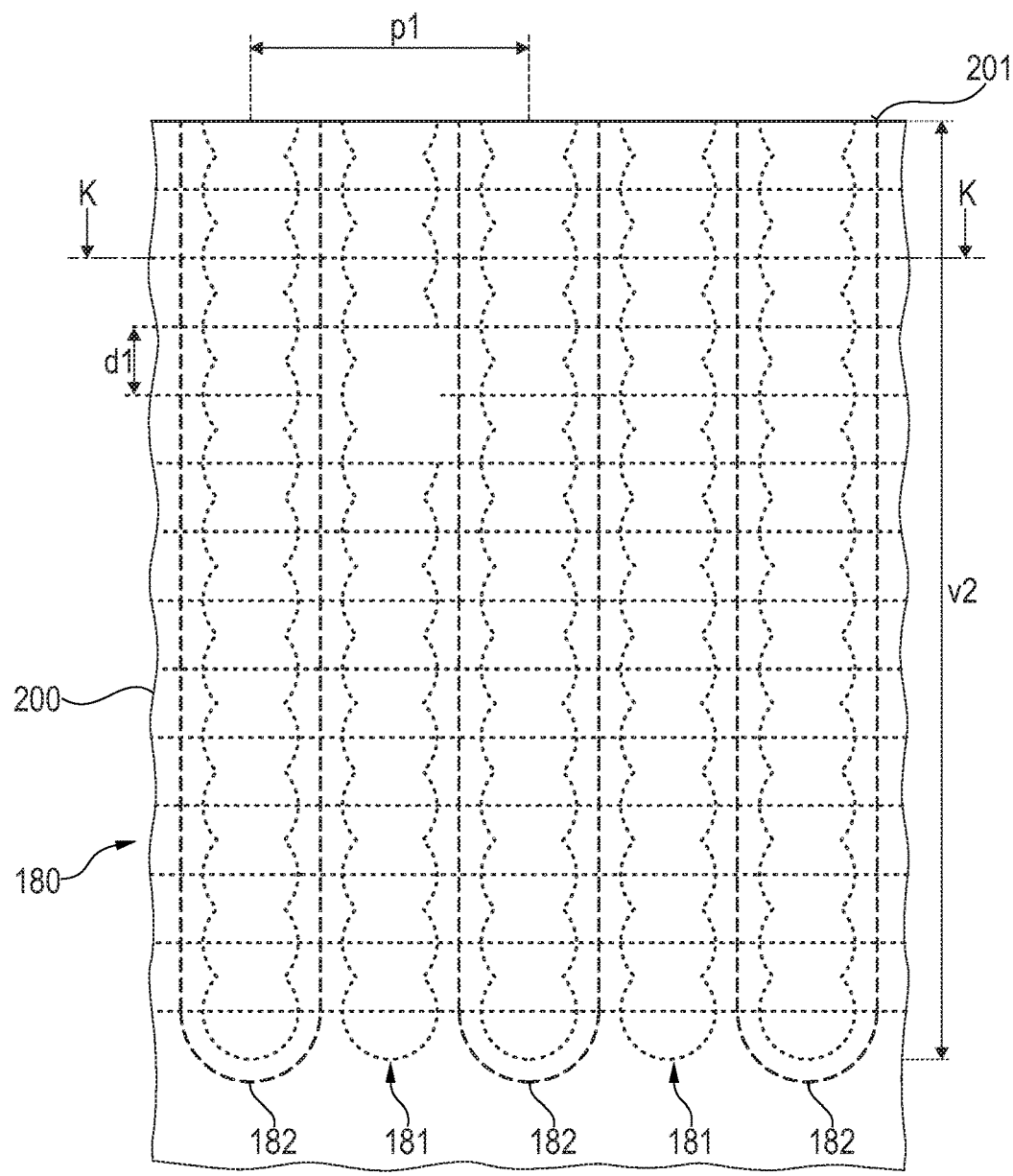
FIG. 2J illustrates a schematic vertical cross-sectional view of the semiconductor workpiece portion of FIG. 2I after a heat treatment for diffusing the implanted dopants to form first and second regions of a superjunction structure.

In FIG. 2J the dotted lines indicate planes of the same dopant concentration, while the broken lines indicate pn junctions, which are approximately planar vertical planes orthogonal to the cross-sectional plane of the drawing approximately in the center between neighboring first and second regions 181, 182. The exact position of the pn junction depends on the mean diffusion length of the first and second dopants, the alignment of the second openings with regard to the first openings, the implant dose of first dopant relatively to the second dopant, the dopant species and the widths of the first and second implant zones 115, 116 of FIG. 2I.

Figure 2K:
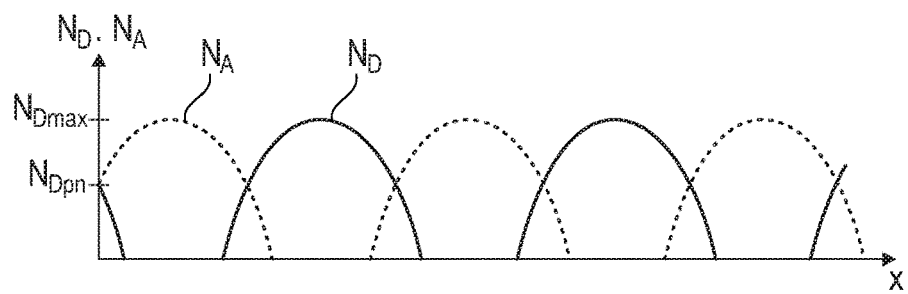
FIG. 2K illustrates a schematic diagram illustrating donor and acceptor concentration profiles along a horizontal cross-cut through the superjunction structure of FIG. 2J.

FIG. 2K shows the horizontal donor and acceptor concentration profiles $N_D$, $N_A$ after the heat treatment. The concentration profiles $N_D$, $N_A$ approximate Gaussian distributions in both the vertical and the horizontal direction. Donors and acceptors horizontally diffuse from neighboring vertical columns 215, 216 into overlap regions. At the pn junction, the donor concentration $N_{DPn}$ may be in a range from 20% to 70%, e.g., at most 50% of the maximum value $N_{Dmax}$ in the horizontal center of the first or second regions 181, 182.

An aspect ratio AR of the second regions 182 in the plane of the drawing, which is given by the ratio vertical extension v2 to horizontal width w3 of the second regions 182, may lie in a range from 10 to 50, e.g., about 20.

Figure 3A:
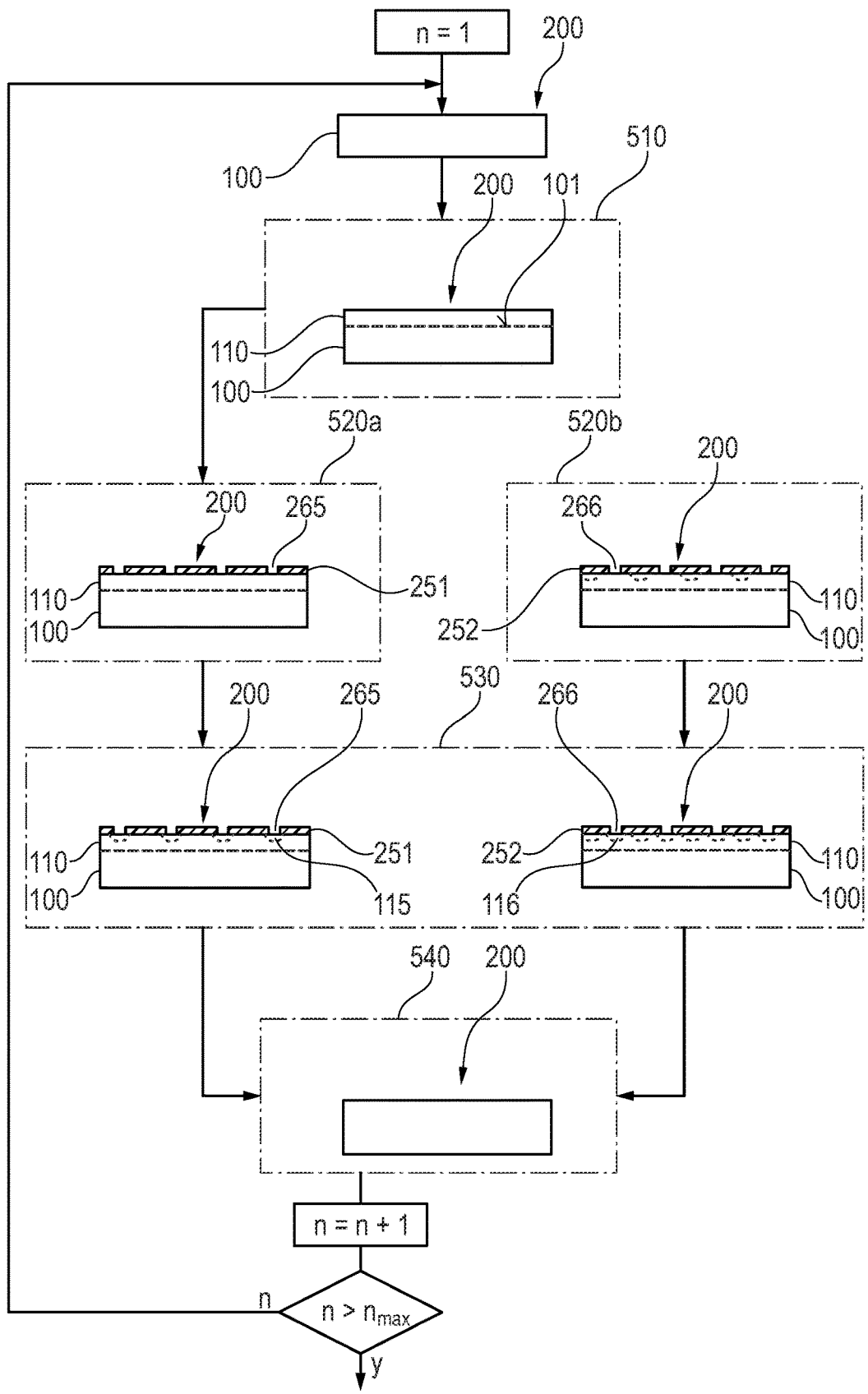
FIG. 3A illustrates a schematic block diagram illustrating a portion of a semiconductor manufacturing apparatus arrangement for manufacturing superjunction semiconductor devices according to an embodiment referring to vertically stacked implant zones.

In FIG. 3A the cycle of growing a semiconductor layer 110 and implanting first and second implant zones 115, 116 is repeated n-times, wherein n is at least nine, for example, at least 13. Within each cycle, the same ion implantation apparatus 530 is used for forming the first and second implant zones 115, 116 in the same semiconductor layer 110. For different cycles, different ion implantation apparatuses 530 may be used, since for each ion implantation apparatus 530 a common-mode type systematic error portion effects implantation of both conductivity types in the same way the systematical deviations can cancel each other out to some degree. According to a further embodiment, the same ion implantation apparatus 530 is used for all cycles n=1 to n=nmax.

Figure 3B:
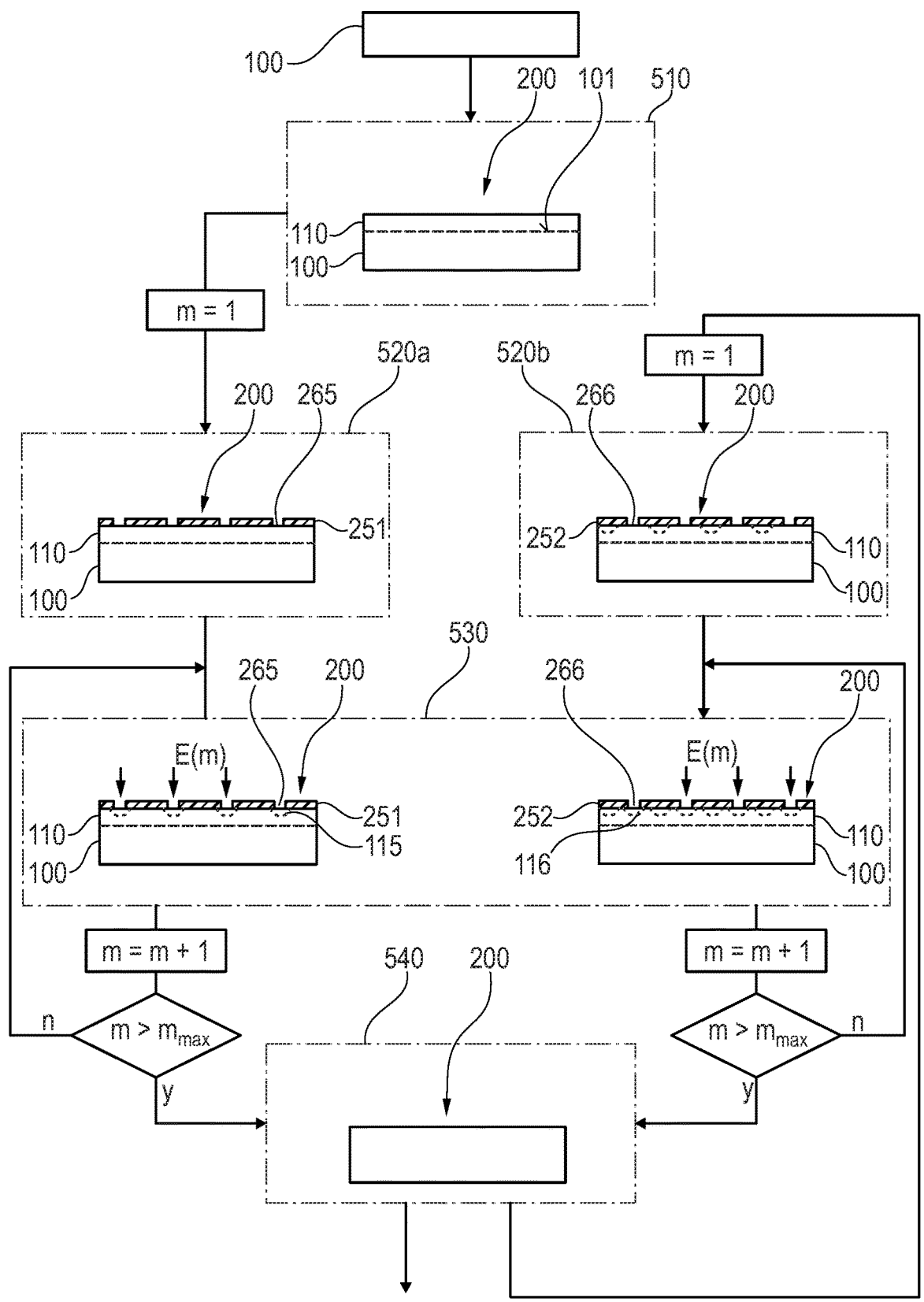
FIG. 3B illustrates a schematic block diagram illustrating a portion of a semiconductor manufacturing apparatus arrangement for manufacturing superjunction semiconductor devices according to an embodiment, wherein a single implant mask is used for multiple implants at different implant energies.

In FIG. 3B the same first implant mask 251 and the same second implant mask 252 are used for implanting at m different acceleration energies E(m). Since the penetration depth of the implanted ions depends on the acceleration energy E(m) two or more first implant zones 115 and two or more second implant zones 116 can be formed at different mean distances to the process surface 201. For a given layer thickness the necessary minimum diffusion length for connecting the first implant zones 115 in the various layers in the vertical direction and for vertically connecting the second implant zones 116 is reduced. The horizontal diffusion is reduced accordingly, which enables a smaller pitch.

Figure 3C:
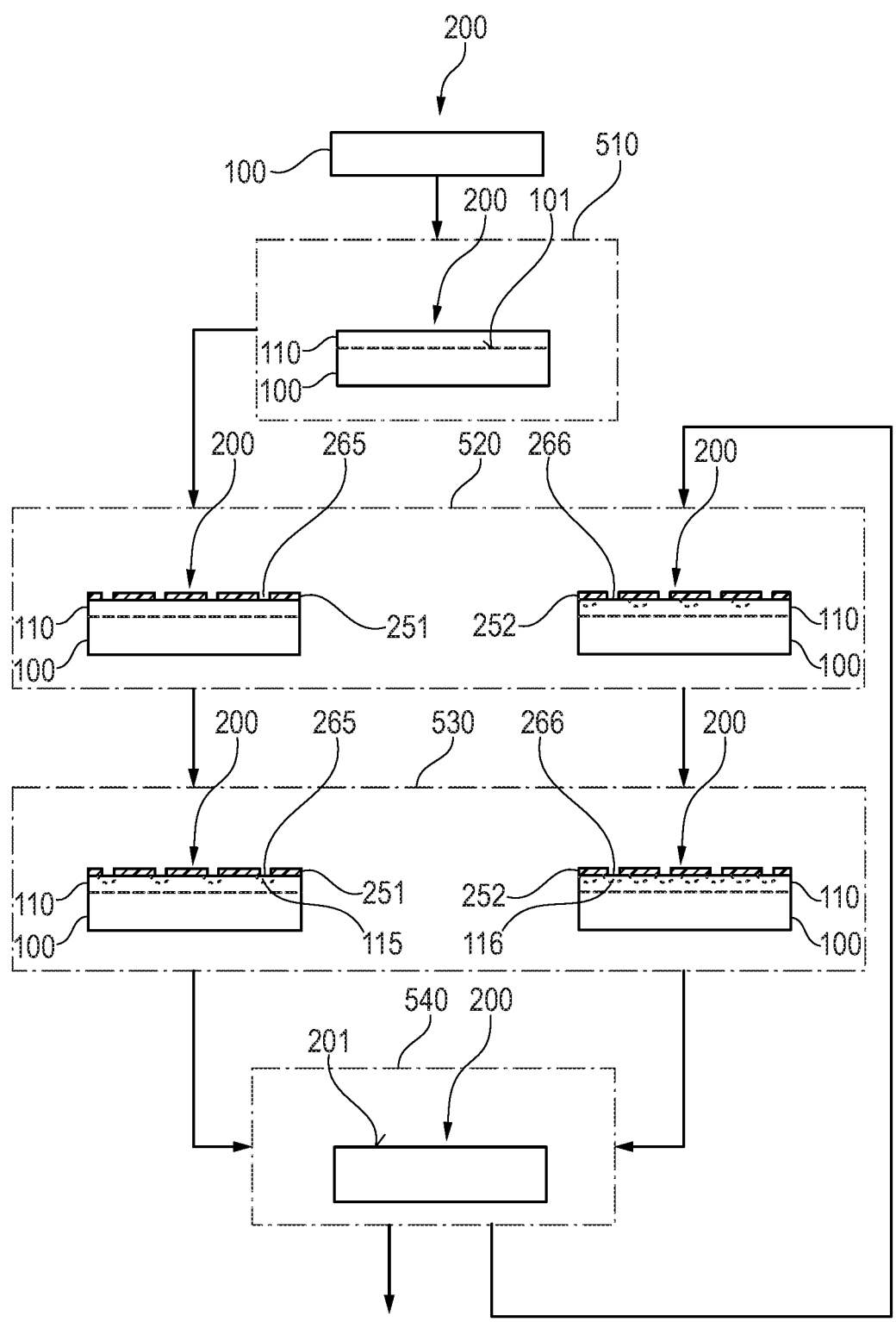
FIG. 3C illustrates a schematic block diagram illustrating a portion of a semiconductor manufacturing apparatus arrangement for manufacturing superjunction semiconductor devices according to an embodiment using subunits of the same lithography apparatus for defining implant masks for both types of dopants.

In FIG. 3C the same lithography apparatus 520 is used for forming the first implant mask 251 and the second implant mask 252 for the same semiconductor layer 110, i.e., for defining the first and second implant zones 115, 116 in the same plane.

The lithography apparatus 520 includes a photoresist application unit for depositing a photoresist layer on the process surface 201. Tracks align the semiconductor workpieces 200 to a lithographic exposure unit such that firstly the pattern on a reticle is imaged into the photoresist layer by locally polymerizing unpolymerized constituents of the photoresist layer or by locally depolymerizing polymerized constituents of the photoresist layer to form an exposed photoresist film. A developer unit then selectively removes the polymerized portion of the exposed photoresist film with respect to the unpolymerized portion or the unpolymerized portion selectively with respect to the polymerized portion.

Each of the processes in the subunits of the lithography apparatus 520 shows deviations from a target process, wherein the deviations have impact on the absolute number of charge carriers implanted through the resulting first and second implant masks 251, 252 of FIGS. 2C and 2F, for example, by affecting the width of the first and second openings 265, 266, and/or by affecting a sidewall angle with respect to the process surface 201 and/or by affecting the resist thickness. For superjunction structures, common-mode portions of the process deviations that affect the number of implanted dopants of both types in the same way cancel each other out to some degree.

Figure 4A:
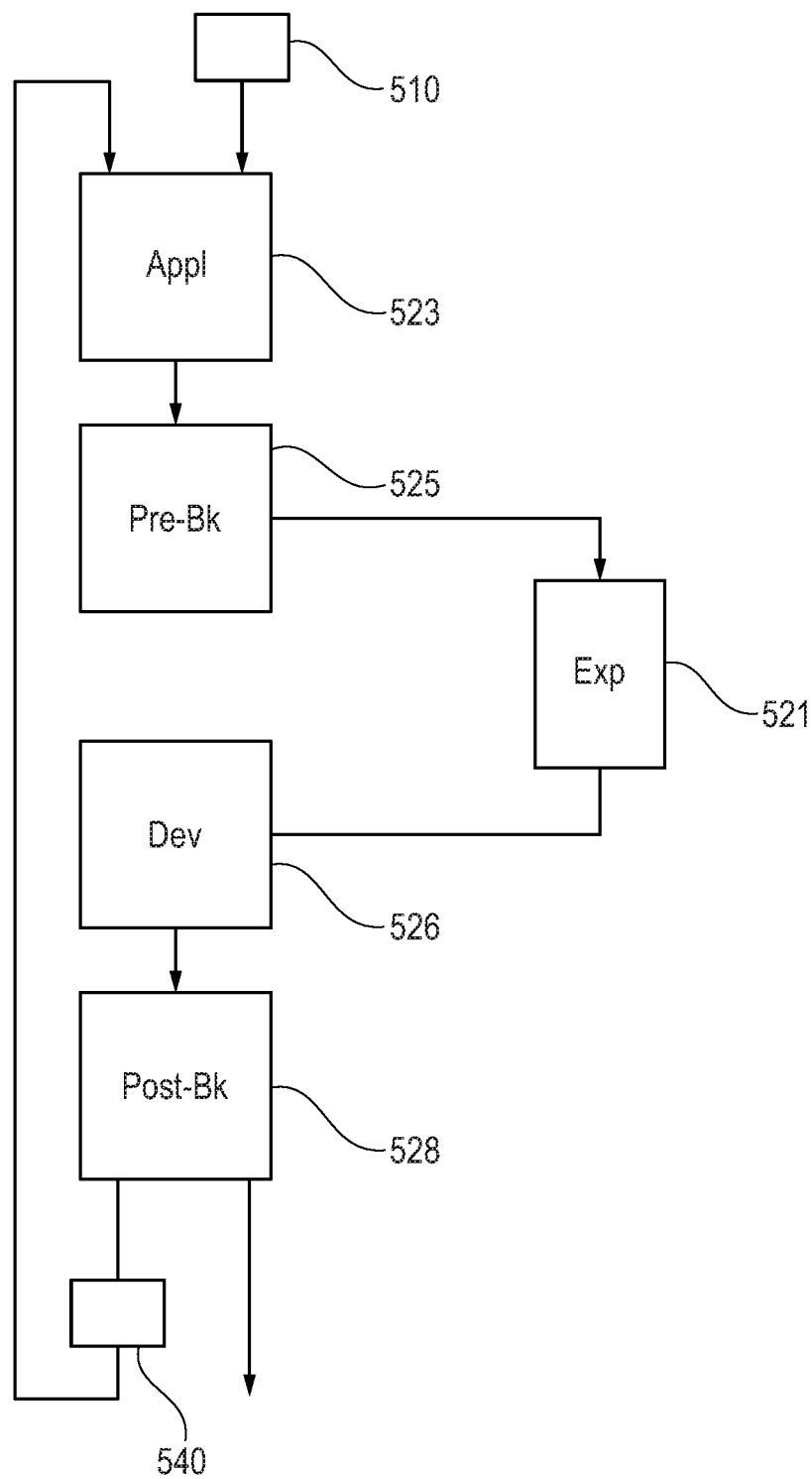
FIG. 4A illustrates a schematic block diagram of a lithography apparatus according to an embodiment with separated subunits for photoresist application and development.
Figure 4B:
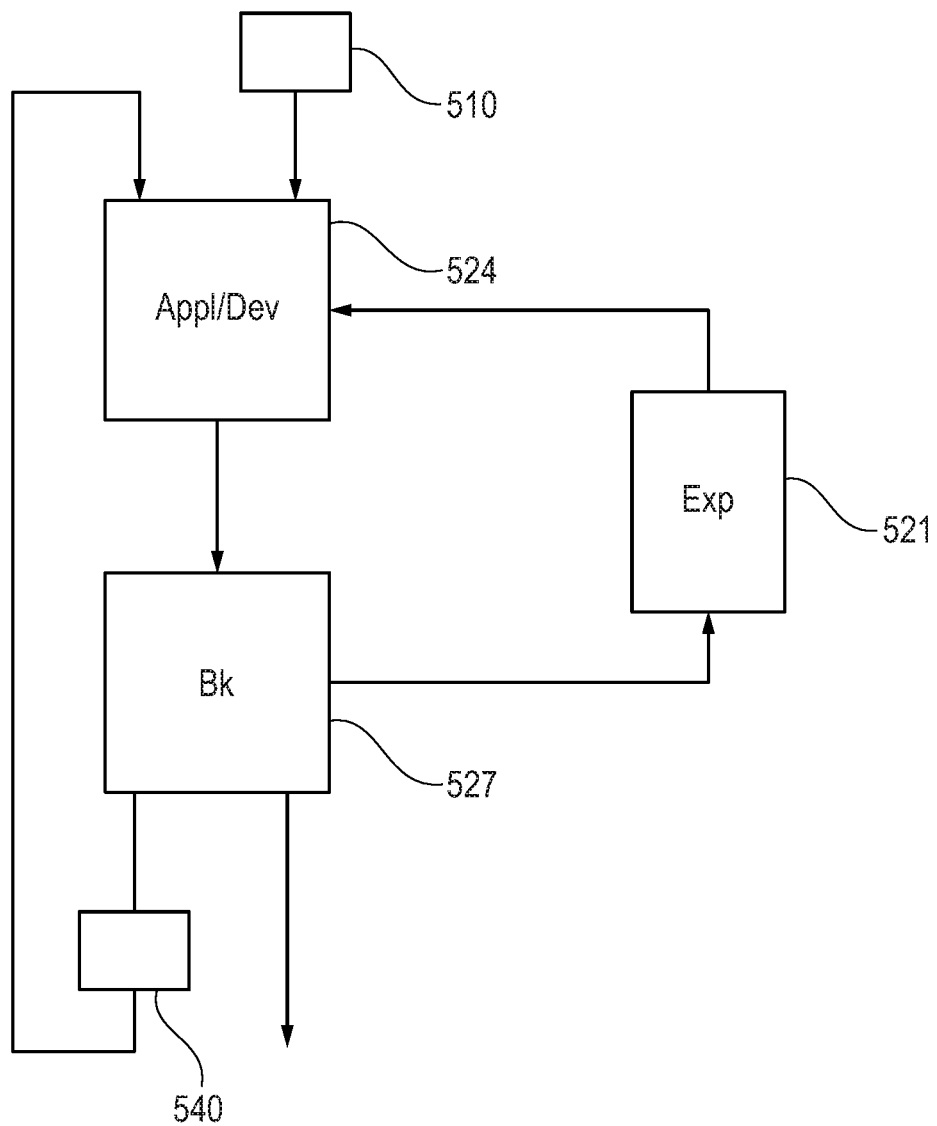
FIG. 4B illustrates a schematic block diagram of a lithography apparatus according to an embodiment with a combined chuck unit for photoresist application and development.
Figure 4C:
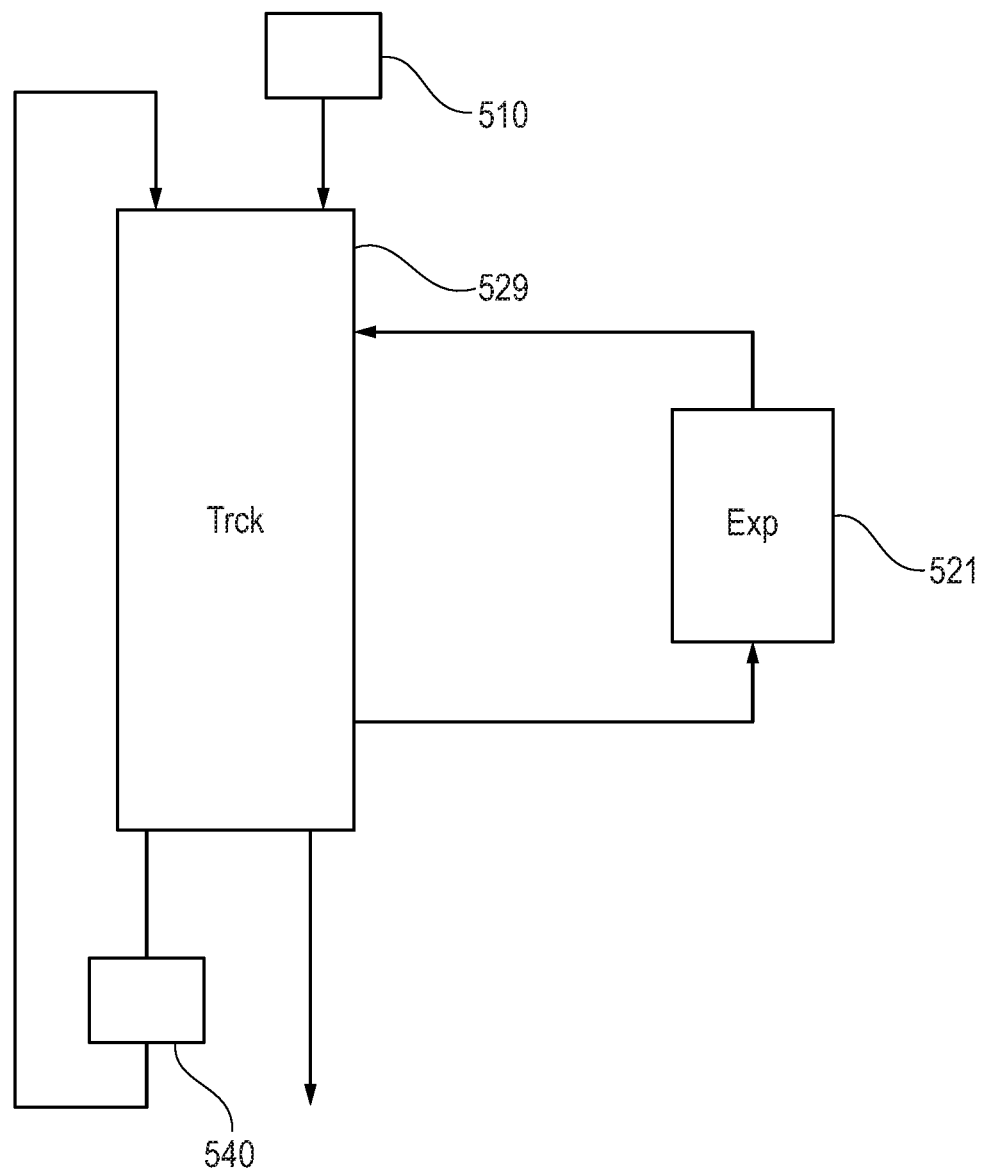
FIG. 4C illustrates a schematic block diagram of a lithography apparatus according to an embodiment with a combined track unit combining photoresist application and development with pre-bake and post-bake.

FIGS. 4A to 4C refer to different kinds of lithography apparatus 520.

In FIG. 4A the lithography apparatus 520 includes a photoresist application unit 523 that applies a viscous or liquid photoresist material onto the process surface and that forms a thin and uniform photoresist layer on the process surface. The photoresist application unit 523 may be a spin-coater that includes a chuck. A dispenser dispenses and spreads a mixture of a photosensitive resist material, solvents and further auxiliary materials on the process surface. The chuck rotates the semiconductor workpiece 200 with the resist material applied thereupon. A final thickness of the resulting photoresist layer may be a function of, inter alia, the acceleration characteristic of the chuck. The thickness of the photoresist layer may have impact on the number of implanted dopants.

A heat treatment in a pre-bake unit 525 evaporates a portion of the solvents contained in the dispensed and spun mixture forming the photoresist layer.

An exposure unit 521 projects the image pattern of a reticle into the photoresist layer by exposing defined portions of the photoresist layer to radiation, for example DUV (deep ultraviolet) radiation. The radiation that impacts on the photoresist layer locally changes the chemical constitution of the photosensitive resist material. For example, the resist material may convert to a more soluble state or to a less soluble state. Depth of focus and exposure dose, which may be subject to systematic deviations, may affect size and sidewall form of openings in the developed photoresist film formed from the photoresist layer.

A developer unit 526 dissolves the more soluble portion selectively against the less soluble portion. Typically, a chemical developer such as alkaline-water solutions or non-ionic solutions dissolves the more soluble portion of the exposed photoresist layer at a higher dissolving rate than the less soluble portion and the less soluble portions for the implant mask. The less soluble portions form the implant masks. Since the developer unit 526 to some degree also removes the less soluble portions of the photoresist film, process time and process conditions of the developer process may have impact on the size of the openings in the implant mask formed from the developed photoresist film.

A post-bake in a post-bake unit 528 evaporates remnant solvents and hardens the patterned implant mask. Since the heat treatment may result in a shrink of the photoresist in all directions, temperature gradient and temperature deviations in the post-bake unit 528 may have impact on the size of the first and second mask openings.

Using at least one of the subunits of the lithography apparatus 520 for both implants in the same implantation plane cancels out a common-mode portion of a systematic process deviation in the concerned subunit.

The functional subunits of the lithography apparatus 520 of FIG. 4A may be configured in different ways.

In FIG. 4A each functional subunit as described above may correspond to a physical unit.

In FIG. 4B a chuck unit 524 that rotates the semiconductor workpiece 200 is used for photoresist application and development and a heating chamber 527 is used for both the pre-bake and the post-bake.

In FIG. 4C a track unit 529 combines the functionality of the chuck unit 524 and of the heating chamber 527 of FIG. 4B.

Figure 5A:
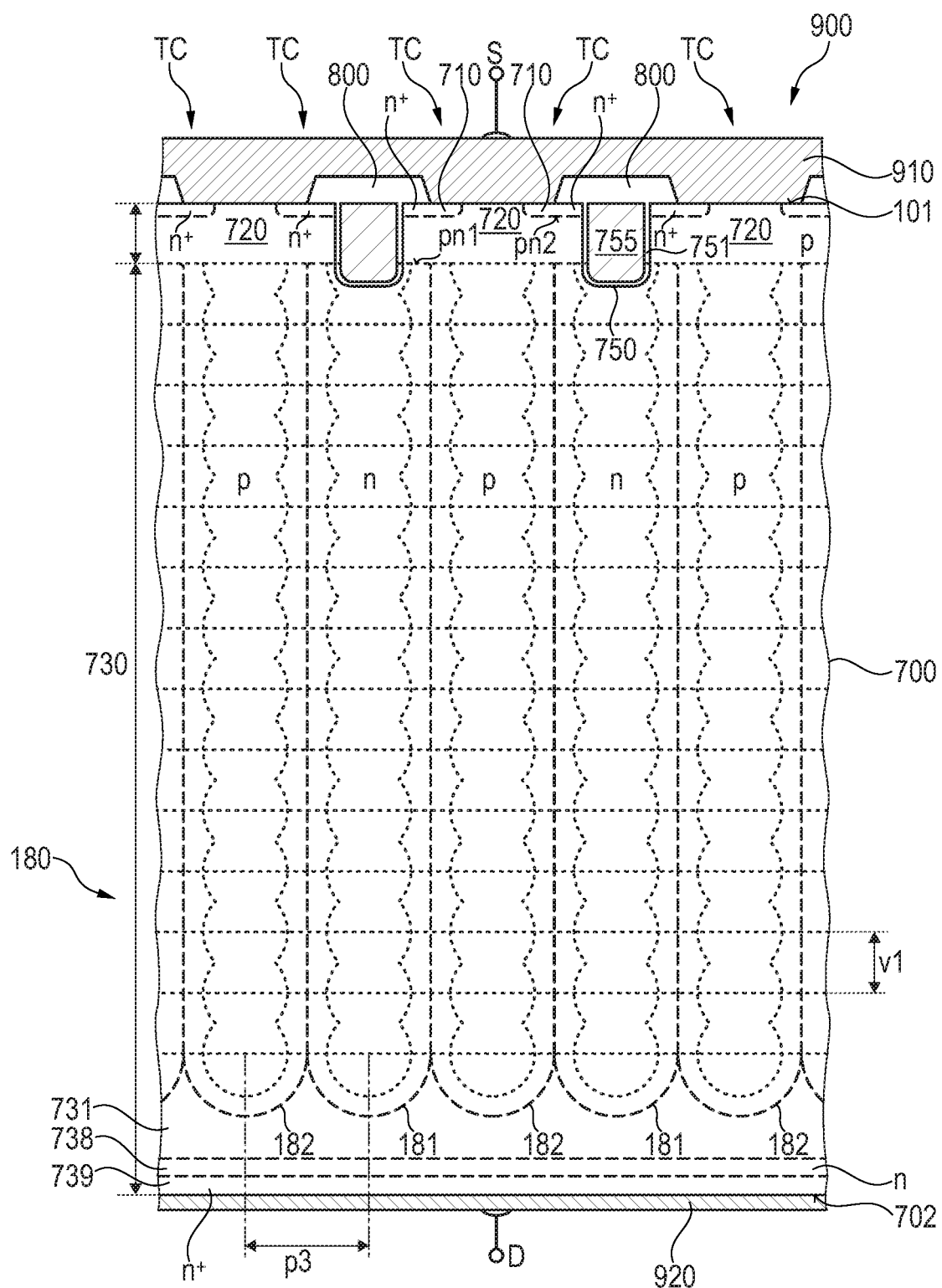
FIG. 5A illustrates a schematic vertical cross-sectional view of a portion of a superjunction semiconductor device according to an embodiment concerning transistor cells based on trench gates.
Figure 5B:
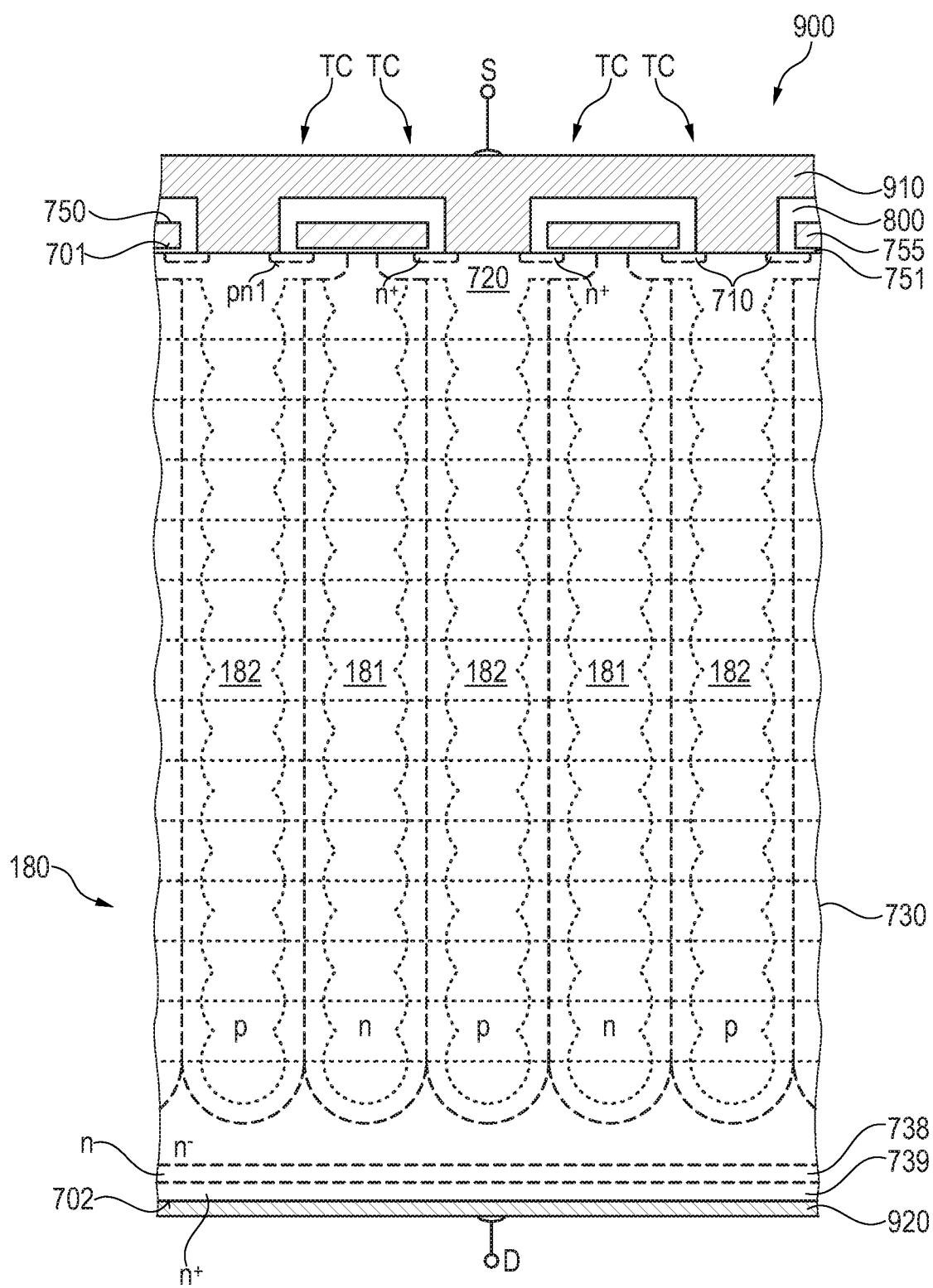
FIG. 5B illustrates a schematic vertical cross-sectional view of a portion of a superjunction semiconductor device according to an embodiment concerning transistor cells based on planar gates.

FIGS. 5A and 5B concern a semiconductor device 900, which may be or may include an IGFET (insulated gate field effect transistor), an IGBT (insulated gate bipolar transistor), or a power semiconductor diode, e.g. an MGD (MOS gated diode). The semiconductor device 900 includes functional transistor cells TC or an anode zone of a diode through which a load current directly flows in an on-state or forward mode of the semiconductor device 900, wherein the functional transistor cells TC are formed in a transistor cell region which is surrounded by a termination region without functional transistor cells.

The semiconductor device 900 includes a semiconductor portion 700 of a semiconductor material, such as crystalline silicon. The semiconductor portion 700 may include a drain structure 730 including a superjunction structure 180 with the first and second regions 181, 182 as described with reference to FIGS. 2J and 2K.

The transistor cells TC are formed along a first surface 701 of the semiconductor portion 700 and are electrically connected to a first load electrode 910. Along a second surface 702 opposite to the first surface 701, the drain structure 730 includes a heavily doped contact layer 739 electrically connected to a second load electrode 920. A field stop layer 738 with a lower dopant concentration than the contact layer 739 may be sandwiched between the contact layer 739 and a low doped drift zone 731 into which the superjunction structure 180 extends.

A vertical extension of the superjunction structure 180 may be 40 μm. A horizontal center-to-center distance p3 between neighboring second regions 182 and between neighboring first regions 181 of the superjunction structure 180 may be in a range from 3 μm to 5.4 μm, e.g., about 4 μm. An aspect ratio AR given by the ratio v2:(0.5*p3) may be in a range from 10 to 50, e.g., about 20. The area-related on-state resistance RDSon*Active is less than 0.8 Ωmm$^2$ for a device with a breakdown voltage of 600V. The superjunction structure 180 is depletable at a blocking voltage of less than 20V.

At least in a central portion of the transistor cell region, the first regions 181 may be equidistant to each other and the second regions 182 may be equidistant to each other. The distance between neighboring first regions 181 may vary on an edge region of the transistor cell region and/or in the termination region that surrounds the transistor cell region.

In FIG. 5A gate structures 750 of the transistor cells TC are trench gates extending from the first surface 701 into the drain structure 730. The gate structures 750 include a conductive gate electrode 755 and a gate dielectric 751 separating the gate electrode 755 from the semiconductor portion 700. Between neighboring gate structures 750 body zones 720 extend between the first surface 701 and the second regions 182. The body zones 720 form first pn junctions pn1 with the first regions 181, unipolar homojunctions with the second regions 182 and second pn junctions pn2 with source zones 710 that are wells extending from the first surface 701 along the gate structures 750 into the body zones 720. Both the body zones 720 and the source zones 710 are electrically connected to the first load electrode 910. An interlayer dielectric 800 electrically separates the first load electrode 910 and the gate electrodes 755.

The first load electrode 910 may be or may be electrically coupled or connected to a source electrode S in case the semiconductor device 900 is an IGFET, to an emitter terminal in case the semiconductor device 900 is an IGBT or to an anode terminal in case the semiconductor device is a diode. The second load electrode 920 may form or may be electrically connected to a drain terminal D in case the semiconductor device 900 is an IGFET, a collector terminal in case of an IGBT or a cathode terminal in case of diode.

In other words, the superjunction semiconductor device 500 includes transistor cells TC electrically connected in parallel and including source zones 710 as well as body zones 720 formed in a semiconductor portion 700 and electrically connected with a first load electrode 910. A heavily doped contact layer 739 in the semiconductor portion 700 forms an ohmic contact with a second load electrode 920. A drain structure 730 between the body zones 720 and the second load electrode 920 includes first regions 181 forming first pn junctions pn1 with the body zones 720 and second regions 182 directly adjoining the first regions 181 and forming unipolar junctions with the body zones 720, wherein a lateral center-to-center distance p3 between neighboring first regions 181 is at most 5.4 µm.

In FIG. 5B the gate structures 750 are planar gates formed on the first surface 701.

Figure 6:
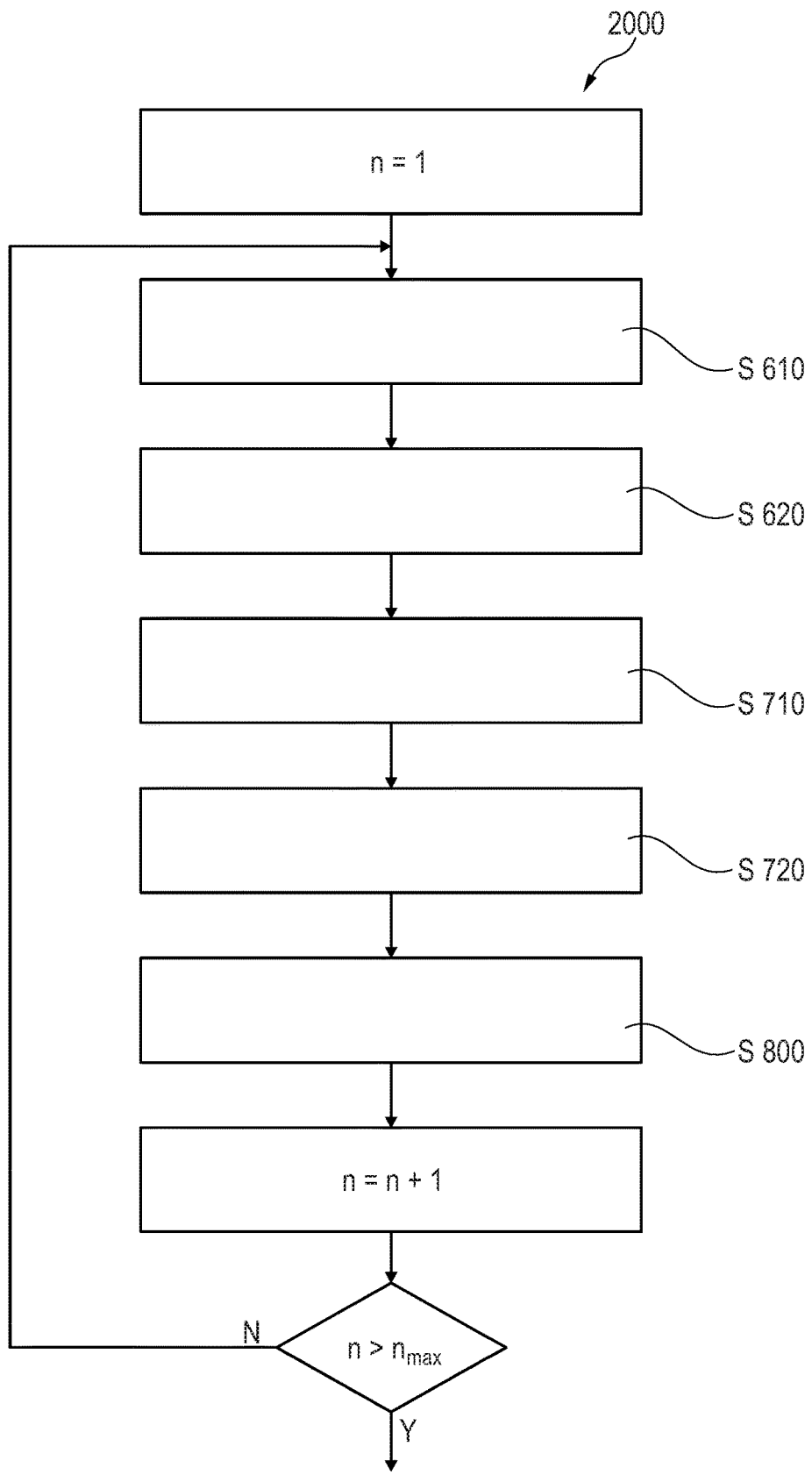
FIG. 6 illustrates a schematic flow chart of a method of manufacturing superjunction semiconductor devices using the same ion implantation apparatus for forming complementarily doped first and second regions of a superjunction structure according to a further embodiment.

FIG. 6 is a schematic flow-chart for illustrating a method 2000 of manufacturing a superjunction semiconductor device according to another embodiment.

A process feature S610 forms a first implant mask on an exposed process surface of a semiconductor workpiece, wherein the first implant mask includes first openings. A process feature S620 implants, by using an ion implantation apparatus, first dopant ions of a first conductivity type through the first openings, wherein first implant zones are formed in the semiconductor workpiece. A process feature S710 forms a second implant mask on the process surface, wherein the second implant mask includes second openings between the first implant zones. By using the ion implantation apparatus used for implanting the first dopant ions, a process feature S720 implants second dopant ions of a complementary second conductivity type through the second openings, wherein second implant zones are formed in the semiconductor workpiece between the first implant zones. A process feature S800 forms, by epitaxy, a semiconductor layer on the process surface of the semiconductor workpiece.

The first implant mask may be removed before forming the second implant mask. Before removing the first implant mask, implanting of the first dopant ions at the ion implantation apparatus may be repeated m-times at m different acceleration energy levels. Before removing the second implant mask, implanting of the second dopant ions at the ion implantation apparatus may be repeated m-times at m different acceleration energy levels.

The depth at which ions are implanted within the epitaxial layer is dependent on the acceleration energy used to implant the ions. A higher acceleration energy results in a greater implant depth of the ions within the epitaxial layer, i.e. a greater distance from the outermost surface of the epitaxial layer.

A multi-implantation method in which the first ions are implanted into the same first regions using two or more different acceleration energy levels may be used to implant the first ions at different depths within the epitaxial layer and to produce a more uniform implant dose in the vertical direction within the epitaxial layer. Such a multi-implantation method may also be considered as a multi-step method in which the first ions are implanted into a first region using a different acceleration energy level for each implant step.

Similarly, the second ions may be implanted using a multi-implantation method in which second ions are implanted into a second region using a different acceleration energy level for each implant step.

Forming of a first implant mask on the exposed process surface of the semiconductor workpiece, implanting of the first dopant ions, forming of a second implant mask on the process surface of the semiconductor workpiece, and forming of a semiconductor layer on the process surface of the semiconductor workpiece may be repeated n-times, wherein the n-th semiconductor layer is formed on an exposed process surface of the (n−1)th semiconductor layer, with n≥2 and wherein for each of the semiconductor layers the first and second dopant ions are implanted by using the same ion implantation apparatus. The number n may be greater than 12.

The first and second implant masks may be formed by using a same lithography apparatus for both implants, by using a same photoresist application unit for forming a photoresist layer on the exposed process surface, by using a same exposure unit for transferring a pattern on a reticle into the photoresist layer to form a photoresist film used for defining the first or the second implant mask and/or by using a same developer unit for removing a more soluble portion of an exposed photoresist film used for defining the first or the second implant mask selectively against a less soluble portion.

The semiconductor workpiece may be heated to form, from the implanted ions, doped regions of a superjunction structure, wherein a diffusion length of the ions of the first and second dopants is at most 1.5 µm. A center-to-center distance between neighboring first implant zones may be at most 5.4 µm. The semiconductor layer may be formed at a temperature of at most 1150° C. A diameter of the semiconductor workpiece may be 300 mm.

In order to reduce the lateral area of a superjunction device, the lateral area of the superjunction structure may be reduced, for example by reducing the pitch of the compensation columns. As the pitch of the compensation columns is decreased, the doping concentration of the columns may be correspondingly increased to reduce the RDSON. However, any difference in the doping concentration of the compensation columns of opposing conductivity types has a correspondingly greater undesirable influence on the breakdown voltage, i.e. reduces the breakdown voltage. In methods in which the compensation columns of opposing conductivity are fabricated by implanting first ions and second ions into a plurality of sequentially deposited undoped epitaxial layers, two lithographic or mask processes may be carried out for each epitaxial layer; one to form first openings through which the first ions are implanted and one to form second openings through which the second ions are implanted.

The actual dose of the first ions or the second ions in the epitaxial layer is affected by the size of the opening through which the first ions or second ions are implanted as well as the implanting conditions. In order that the difference between dose of the first ions and the second ions in the first and second regions, respectively, of a common epitaxial layer is further reduced or held within a predetermined tolerance, in some embodiments, one or more further measures may be undertaken. These further measures may be undertaken in place of the use of the same apparatus or in addition to the use of the same apparatus to implant the first ions and second ions into a common epitaxial layer, for example.

In order to reduce any difference between the dose of the first ions in the first region and the dose of the second ions in the second region of the common epitaxial layer, further optimisation methods may be carried out. In some embodiment, run-to-run control is performed. For example, run-to-run control of the lithography process may be performed. In some embodiments, run-to-run control for the formation of the openings in the soft mask is performed. This may be performed by measuring the openings formed in the mask and regulating the lithographic process in the next run to avoid any further deviation in the size of the openings from the desired size, in particular lateral dimensions, for example width. In some embodiments, the status of the apparatus may be taken into account, for example, the age of the lamp or properties of the lens, in order that the size of the openings of a subsequent layer do not differ by greater than a predetermined amount.

In some embodiments, a feed forward loop, i.e. lithography to implanter or lithography to lithography, within a single epitaxial layer may be performed. For example, if the opening has a width that is slightly larger than the desired value, the implanting conditions may be adjusted, for example the implanting dose may be reduced, such that the lateral dose in the epitaxial layer is the same or as similar as possible to the lateral dose achieved into an opening having the desired width.

Figure 7:
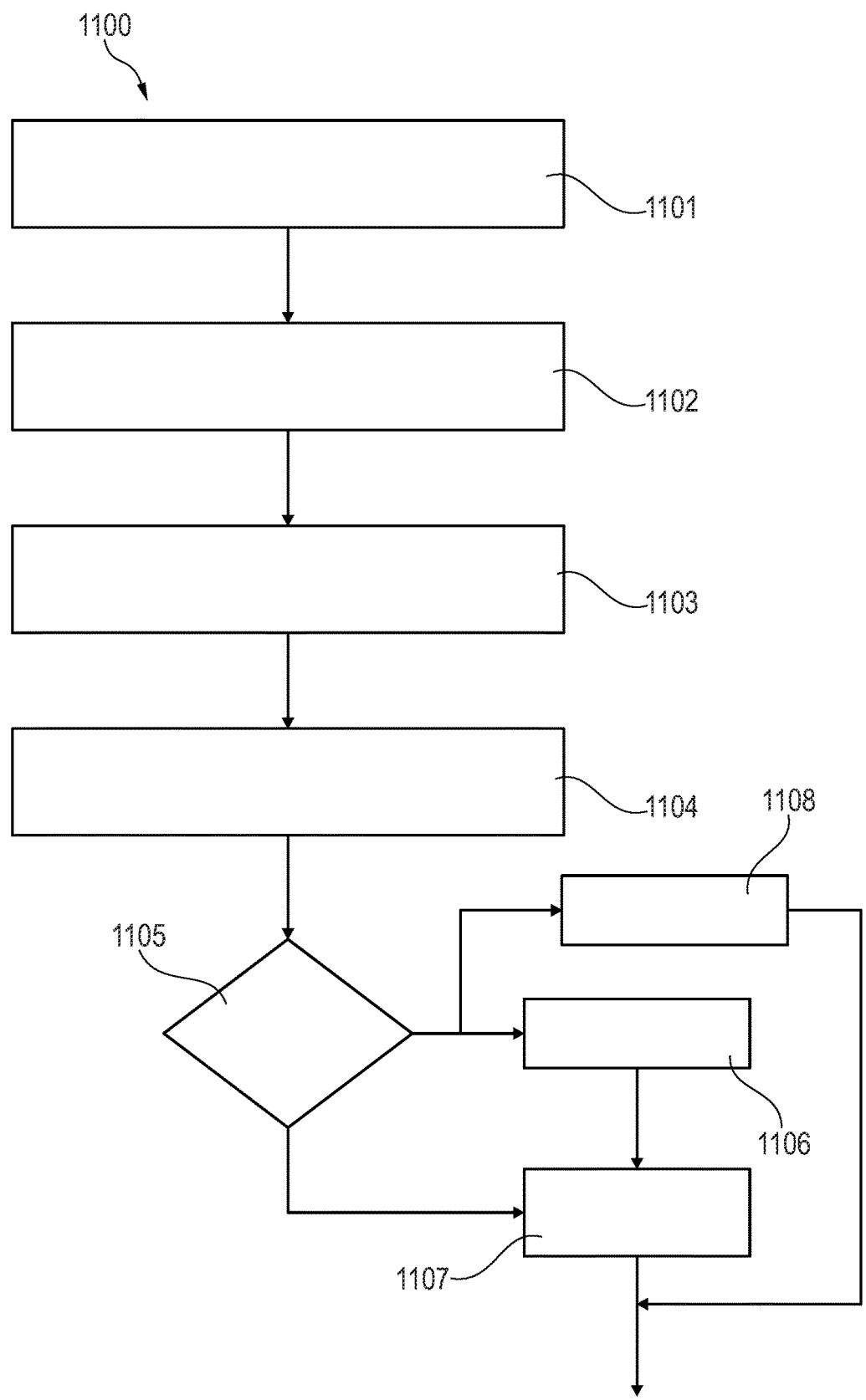
FIG. 7 illustrates a flow chart of a method for manufacturing a superjunction device.

FIG. 7 illustrates a flow chart 1100 of a method. In block 1101, a first photosensitive polymer layer is applied to an epitaxial layer. In block 1102 a first opening is formed in the first photosensitive polymer layer. In block 1103, the size of the first opening in the first photosensitive polymer layer is determined. In block 1104, a difference between the measured size of the first opening and the desired nominal size of the first opening is determined. In decision diamond 1105, it is determined if the difference is greater than a predetermined limit, and if the difference is greater than a predetermined limit one or more measures may be undertaken. The size of the first opening may be determined by SEM (Scanning Electron Microscopy) measurement techniques. If the difference is less than a predetermined limit, the method may proceed to block 1107. In block 1107, the first ions are implanted into the first openings.

In some embodiments, if the difference between the measured size of the first opening and the desired nominal size of the first opening is determined in decision diamond 1105 to be greater than the predetermined limit, the method proceeds to block 1106 and the size of the first opening may be adjusted so that it lies within the predetermined limit. For example, the size of the opening may be increased by plasma etching. In block 1107, the first ions may then be implanted into the worked first opening to form the first region.

Alternatively or in addition, if the difference between the measured size of the first opening and the desired nominal size of the first opening is greater than the predetermined limit, the method may proceed to block 1108 and a dose of the first ions implanted through the first opening may be adjusted so that the dose of the first ions in the first region lies within a tolerance range, for example the tolerance range of the first implant characteristic in the first region. The method may then proceed to the method illustrated in the flow chart 1110 of FIG. 8.

Figure 8:
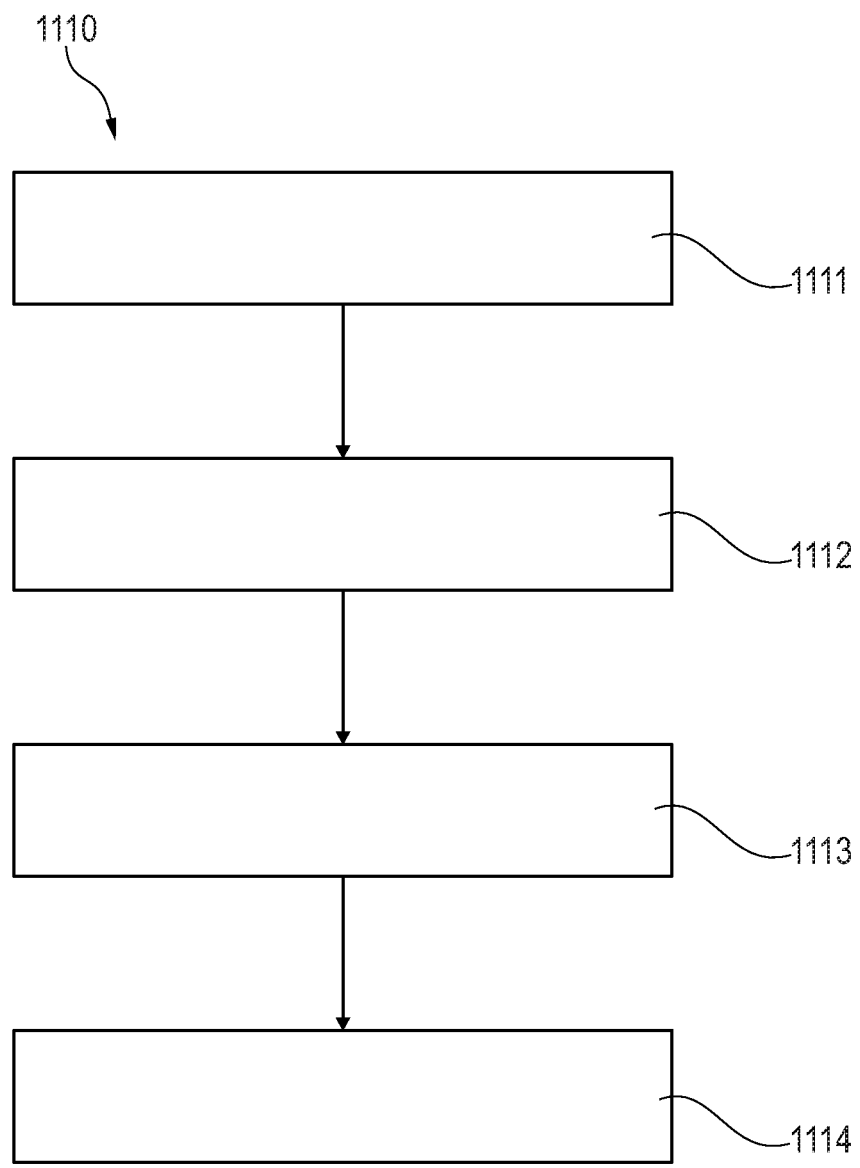
FIG. 8 illustrates a flow chart of a method for manufacturing a superjunction device.

In some embodiments, as illustrated in connection with the flow chart 1110 of FIG. 8, after the first ions are implanted into the first opening, the method may include, in block 1111, removing the first photosensitive polymer layer. In block 1112 a second photosensitive layer is applied to the epitaxial layer. In block 1113, a second opening is formed in the second photosensitive polymer layer. The second opening is positioned laterally adjacent and spaced apart from the first region comprising the first ions and the first region is covered by the second photosensitive polymer layer. In block 1114, the second ions are implanted into the second opening to form the second region.

In some embodiments, any difference in the dose of the first ions in the first region caused by a deviation in the size of the first opening from an ideal value may be tolerated or tolerated up to a predetermined limit and the difference between the dose in the first region and the second region of the common epitaxial layer reduced by adjusting the manufacturing conditions for the second region.

Figure 9:
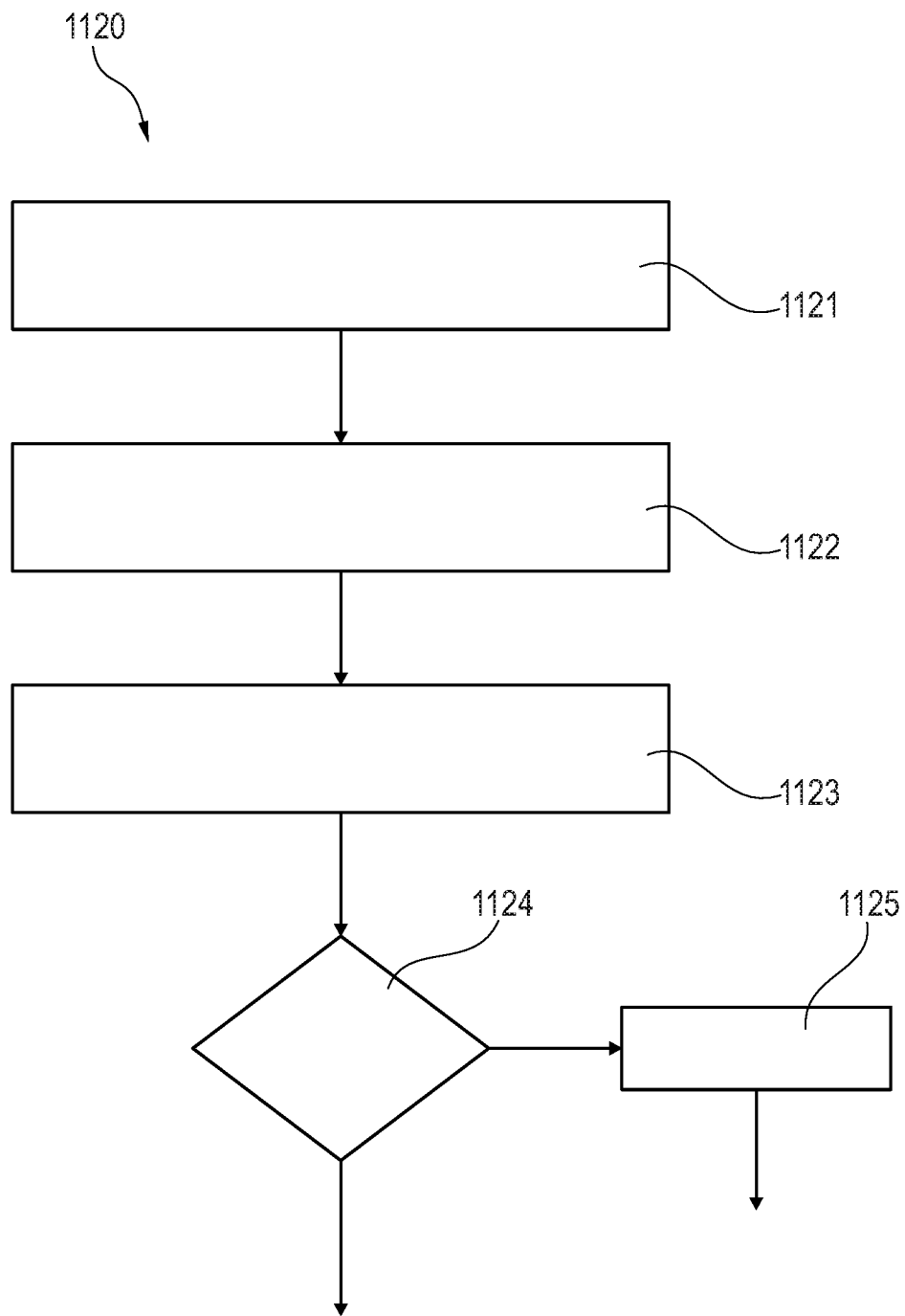
FIG. 9 illustrates a flow chart of a method for manufacturing a superjunction device.

FIG. 9 illustrates a flow chart 1120 of a method in which, in block 1121, the first ions are implanted into the first opening of a first mask arranged on an epitaxial layer. In block 1122 the size of the first opening in the first photosensitive polymer layer is determined. In block 1123, a difference between the measured size of the first opening and the desired nominal size of the first opening is determined. In decision diamond 1124, it is determined if the difference is greater than a predetermined limit. If the difference is greater than the predetermined limit, the method proceeds to block 1125 and the exposure conditions applied to the second photosensitive polymer layer applied to the epitaxial layer to form the second opening are adjusted, and/or a dose of the second ions implanted through the second opening is adjusted so that the dose of the second ions in the second region lies within a tolerance range of the dose of the first ions in the first region.

The tolerance range or acceptable maximum difference $\Delta$ between the dose $D1$ of the first ions in the first region and the dose $D2$ of the second ions in the second region may be $\pm 2\%$ $D_1$ or $\pm 1\%$ $D_1$.

A further epitaxial layer may be deposited onto the epitaxial layer covering the first and second regions, a third photosensitive polymer layer is applied to the further epitaxial layer and the method repeated so that third openings are formed in the third photosensitive layer that are positioned above and vertically aligned with the first regions in the underlying epitaxial layer and first ions implanted into the first openings. Similarly, after removal of the third photosensitive polymer layer, a fourth photosensitive polymer layer is applied to the further epitaxial layer and the method repeated so that second openings are formed in the fourth photosensitive layer that are positioned above and vertically aligned with the second regions in the underlying epitaxial layer and second ions are implanted into the second openings. After the desired number of epitaxial layers with discrete regions of first ions arranged in vertical stacks and discrete regions of second ions arranged in vertical stacks are formed, a diffusion process may be carried out using conditions such that the first ions diffuse laterally and vertically outwards from the first regions to join one another in a vertical direction to produce compensation column having a first conductivity type and such that the second ions diffuse laterally and vertically outwards from the second regions to join one another in a vertical direction to produce compensation column having a second conductivity type opposing the first conductivity type. The first ions and second ions diffuse laterally by a distance that is sufficiently small that neighbouring compensation columns are separated by a portion of the epitaxial layer that is undoped.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of fabricating a superjunction semiconductor device, the method comprising:
    for a first implanting apparatus, selecting nominal implant conditions for implanting ions into a region of a first epitaxial layer of a superjunction semiconductor device formed on a substrate such that the region has a nominal implant characteristic, wherein the first implanting apparatus comprises an intrinsic apparatus implant characteristic that is applied to the nominal implant conditions when implanting the ions using the first implanting apparatus;
    determining an acceptable maximum difference between a first implant characteristic of a first region of the first epitaxial layer comprising first ions for forming a first compensation column of the superjunction semiconductor device, the first compensation column comprising a first conductivity type, and a second implant characteristic of a second region of the first epitaxial layer comprising second ions for forming a second compensation column of the superjunction semiconductor device, the second compensation column comprising a second conductivity type opposing the first conductivity type;
    implanting the first ions into the first region of the first epitaxial layer using the first implanting apparatus and the nominal implant conditions to produce the first region in the first epitaxial layer comprising the first ions and the first implant characteristic; and
    implanting the second ions into the second region of the first epitaxial layer, the second region being laterally spaced apart from the first region, using second nominal implanting conditions estimated to produce the second region in the first epitaxial layer having the second ions and the second implant characteristic that lies within the acceptable maximum difference.

2. The method of claim 1, wherein the intrinsic apparatus implant characteristic causes a variation from the nominal implant characteristic in the first implant characteristic in the first region.

3. The method of claim 1, wherein the second ions are implanted into the second region using the first implanting apparatus.

4. The method of claim 1, wherein the intrinsic apparatus implant characteristic further comprises a time dependent component and the second ions are implanted into the second region using the first apparatus within a pre-determined time period from the implanting of the first ions, wherein the pre-determined time period is estimated to produce the second implant characteristic that lies within the acceptable maximum difference after applying the intrinsic apparatus implant characteristic comprising the time dependent component to the nominal implant conditions.

5. The method of claim 1, wherein the first implant characteristic comprises a dose D and the acceptable maximum difference is the dose D±1%.

6. The method of claim 1, wherein the implanting the first ions in the first region of the first epitaxial layer is carried out two times at different acceleration energy levels, and/or wherein the implanting the second ions in the second region of the first epitaxial layer is carried out two times at different acceleration energy levels.

7. The method of claim 1, further comprising:
    applying a first photosensitive polymer to the epitaxial layer;
    forming a first opening in the first photosensitive polymer layer;
    implanting the first ions into the first opening to form the first region;
    removing the first photosensitive polymer layer;
    applying a second photosensitive layer to the epitaxial layer;
    forming a second opening in the second photosensitive polymer layer, the second opening being positioned laterally adjacent and spaced apart from the first region comprising the first ions, the first region being covered by the second photosensitive polymer layer; and
    implanting the second ions into the second opening to form the second region.

8. The method of claim 7, wherein the first opening has a nominal width $w_1$ and the second opening has a nominal width $w_2$, wherein $w_1=w_2$.

9. The method of claim 7, wherein the first photosensitive polymer layer comprises a first photosensitive polymer composition and the second photosensitive polymer layer comprises the first photosensitive polymer composition.

10. The method of claim 7, wherein the first photosensitive polymer layer is cured using first curing conditions and the second photosensitive polymer layer is cured using the first curing conditions.

11. The method of claim 7, wherein the first photosensitive polymer layer comprises a nominal thickness $t_1$ and the second photosensitive polymer layer comprises a nominal thickness $t_2$, wherein $t_1=t_2$.

12. The method of claim 7, wherein the first photosensitive polymer layer is applied using first lithographic apparatus and the second photosensitive polymer layer is applied using the first lithographic apparatus.

13. The method of claim 7, further comprising:
    determining the size of the first opening in the first photosensitive polymer layer;
    determining a difference between the measured size of the first opening and the desired nominal size of the first opening; and
    if the difference is greater than a predetermined limit, adjusting the size of the first opening.

14. The method of claim 7, further comprising:
    determining the size of the first opening in the first photosensitive polymer layer;
    determining a difference between the measured size of the first opening and the desired nominal size of the first opening; and
    if the difference is greater than a predetermined limit, adjusting a dose of the first ions implanted through the first opening so that the dose of the first ions in the first region lies within a tolerance range of the first implant characteristic in the first region.

15. The method of claim 7, further comprising:
determining the size of the first opening in the first photosensitive polymer layer;
determining a difference between the measured size of the first opening and the desired nominal size of the first opening; and
if the difference is greater than a predetermined limit, adjusting the exposure conditions applied to the second photosensitive polymer layer applied to the epitaxial layer to form the second opening.

16. The method of claim 7, further comprising:
determining a size of the first opening in the first photosensitive polymer layer,
determining a difference between the measured size of the first opening and the desired nominal size of the first opening; and
if the difference is greater than a predetermined limit, adjusting a dose of the second ions implanted through the second opening so that the dose of the second ions in the second region lies within a tolerance range of the dose of the first ions in the first region.

17. The method of claim 1, further comprising:
depositing a second epitaxial layer on the first epitaxial layer comprising the first region having the first ions and the second region having the second ions;
implanting first ions into a third region of the second epitaxial semiconductor layer, the third region being arranged above the first region, wherein the first ions are implanted into the third region using a second implanting apparatus and third nominal implant conditions to produce the third region comprising the first ions and a third implant characteristic, wherein the second implanting apparatus comprises a second intrinsic apparatus characteristic that is applied to the third nominal implant conditions when implanting the first ions using the second implanting apparatus and the third nominal implant conditions; and
implanting second ions into a fourth region of the second epitaxial layer, the fourth region being laterally spaced apart from the third region and arranged above the second region using fourth nominal implanting conditions estimated to produce the fourth region having the second ions and a fourth implant characteristic within a tolerance range.

18. The method of claim 1, wherein a plurality of substrates is arranged in a first order in a handling device, and wherein the method further comprises:
changing the order of the plurality of substrates in the handling device to produce a second order that differs from the first order before implanting first ions and second ions into a further epitaxial layer arranged on the first epitaxial layer.

19. A method of fabricating a superjunction semiconductor device, the method comprising:
implanting first ions into a first region of a first epitaxial layer using a first implanting apparatus and nominal implant conditions to produce the first region in the first epitaxial layer comprising the first ions and a first implant characteristic; and
implanting second ions into a second region of the first epitaxial layer, the second region being laterally spaced apart from the first region, using second nominal implanting conditions estimated to produce the second region in the first epitaxial layer having the second ions and a second implant characteristic that lies within an acceptable maximum difference of the first implant characteristic.

20. The method of claim 19, further comprising:
applying a first photosensitive polymer to the first epitaxial layer;
forming a first opening in the first photosensitive polymer layer;
implanting the first ions into the first opening to form the first region;
removing the first photosensitive polymer layer;
applying a second photosensitive layer to the first epitaxial layer;
forming a second opening in the second photosensitive polymer layer, the second opening being positioned laterally adjacent and spaced apart from the first region comprising the first ions, the first region being covered by the second photosensitive polymer layer; and
implanting the second ions into the second opening to form the second region.

\* \* \* \* \*